(12) United States Patent
Jain

(10) Patent No.: US 9,331,209 B2
(45) Date of Patent: May 3, 2016

(54) NONVOLATILE MEMORY AND THREE-STATE FETS USING CLADDED QUANTUM DOT GATE STRUCTURE

(76) Inventor: Faquir C Jain, Storrs, CT (US)

( * ) Notice: Subject to any disclaimer, the term of this patent is extended or adjusted under 35 U.S.C. 154(b) by 564 days.

(21) Appl. No.: 12/006,974

(22) Filed: Jan. 9, 2008

(65) Prior Publication Data

US 2009/0184346 A1 Jul. 23, 2009

(51) Int. Cl.
| | |
|---|---|
| H01L 29/76 | (2006.01) |
| H01L 29/788 | (2006.01) |
| B82Y 10/00 | (2011.01) |
| H01L 21/28 | (2006.01) |
| H01L 29/10 | (2006.01) |
| H01L 29/12 | (2006.01) |
| H01L 29/165 | (2006.01) |
| H01L 29/423 | (2006.01) |

(52) U.S. Cl.
CPC ............ *H01L 29/7881* (2013.01); *B82Y 10/00* (2013.01); *H01L 21/28273* (2013.01); *H01L 29/1054* (2013.01); *H01L 29/122* (2013.01); *H01L 29/165* (2013.01); *H01L 29/42332* (2013.01)

(58) Field of Classification Search
CPC ............ B82Y 10/00; H01L 21/28273; H01L 29/1054; H01L 29/7881; H01L 29/165; H01L 29/42332; H01L 29/122
USPC ................ 257/315, 317, 321, 325, E29.129, 257/E29.134, E29.3, E29.304, E29.309, 257/E29.316
See application file for complete search history.

(56) References Cited

U.S. PATENT DOCUMENTS

| | | | | |
|---|---|---|---|---|
| 7,432,158 | B1 * | 10/2008 | Rao ........................ | B82Y 10/00 257/E21.209 |
| 2002/0063285 | A1 * | 5/2002 | Wu ..................... | H01L 27/1203 257/347 |
| 2006/0040103 | A1 * | 2/2006 | Whiteford .............. | B82Y 30/00 428/403 |
| 2008/0169501 | A1 * | 7/2008 | Yang ................. | H01L 21/28273 257/321 |

* cited by examiner

*Primary Examiner* — Vongsavanh Sengdara
(74) *Attorney, Agent, or Firm* — Steven M. McHugh

(57) ABSTRACT

The present invention discloses structures and method of fabricating cladded quantum dot gate nonvolatile memory and three-state field-effect transistor devices that can be scaled down to sub-22 nm dimensions and embedded along side with other functional circuits. Another innovation is the design of transport channel, which comprises an asymmetric coupled well structure comprising two or more wells. This structure enhances the retention time in nonvolatile memory by increasing the effective separation between channel charge and the quantum dots located in the floating gate. The cladded quantum dot gate FETs can be designed in Si, InGaAs—InP and other material systems. The 3-state FET devices form the basis of novel digital circuits using multiple valued logic and advanced analog circuits. One or more layers of $SiO_x$-cladded Si quantum dots can also be used as high-k dielectric layer forming the gate insulator over the transport channel of a sub-22 nm FET.

18 Claims, 23 Drawing Sheets

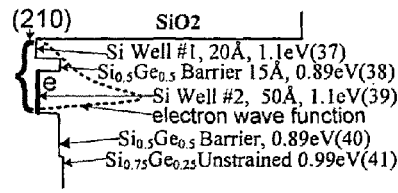
Fig 5(a) Energy band for the strained layer asymmetric coupled well transport channel grown on Si substrate. See advantages of other FETs [ref. 27] reported by our group.
Electron wave function (dashed line) can be made to reside in the second well, increasing its separation form gate insulator #1 (e.g. $SiO_2$) interface with the transport channel.
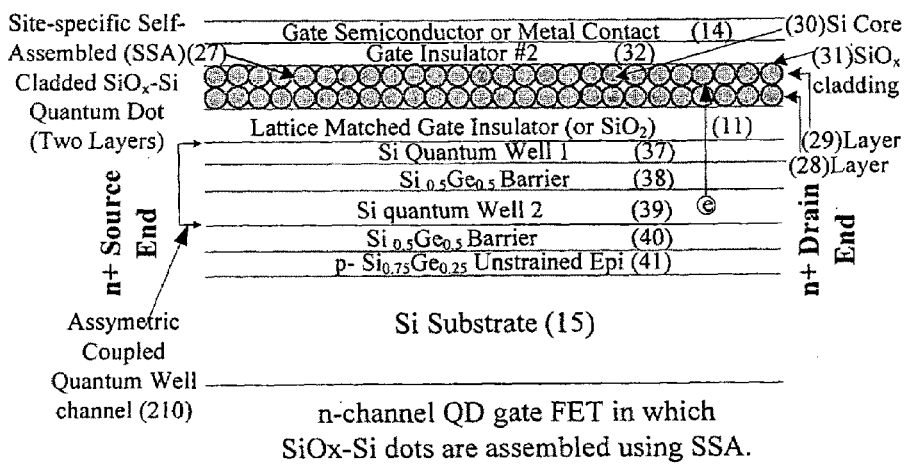
Fig. 5b

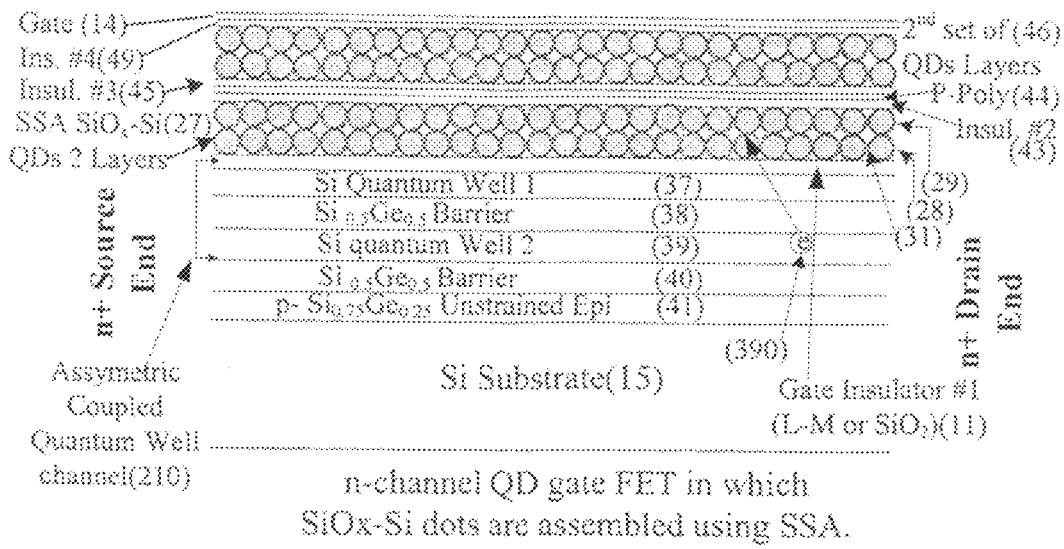
Fig. 5(c-1). Two sets of QD layers
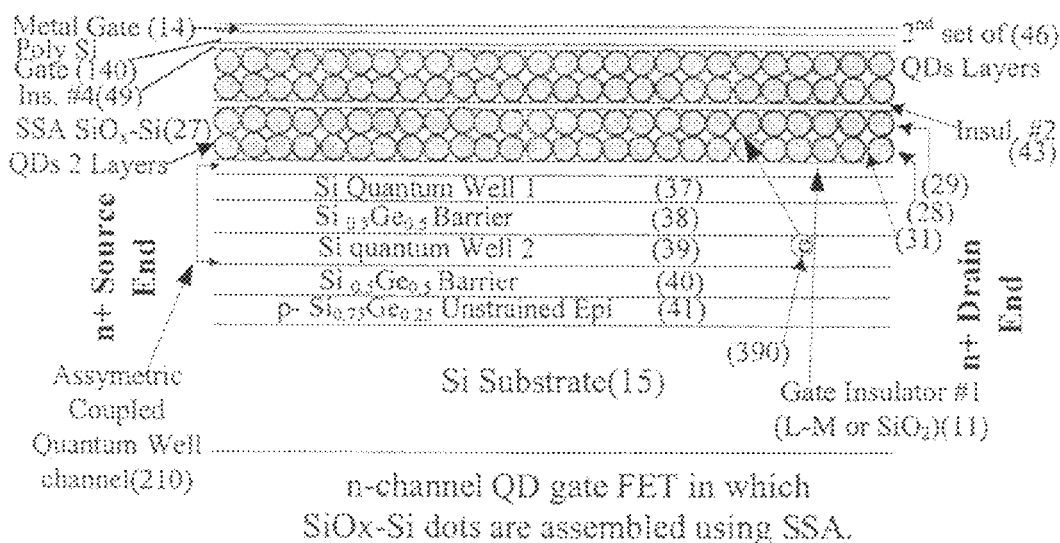
Fig. 5(c-2). Two sets of QD layers
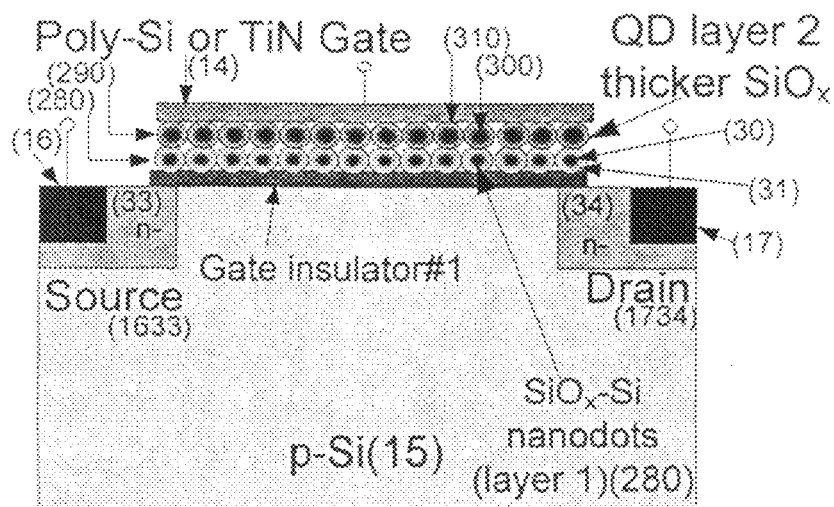
Fig. 5(d)

n-channel QD gate FET in which
SiOx-Si dots are assembled using SSA.

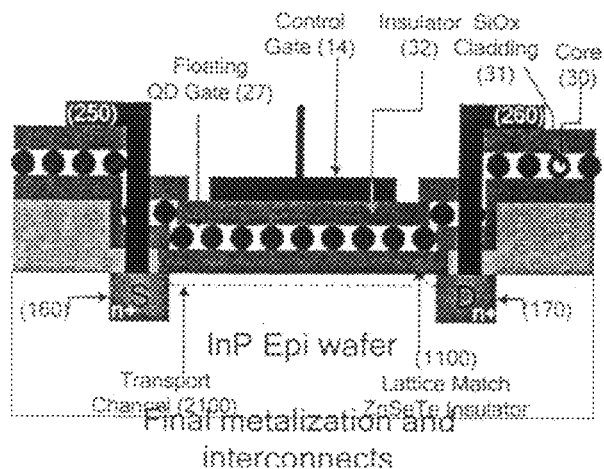
Fig. 7 (a) Cross-sectional schematic of InGaAs-InP based floating SiOx-Si nanocrystal quantum dot gate nonvolatile memory device.
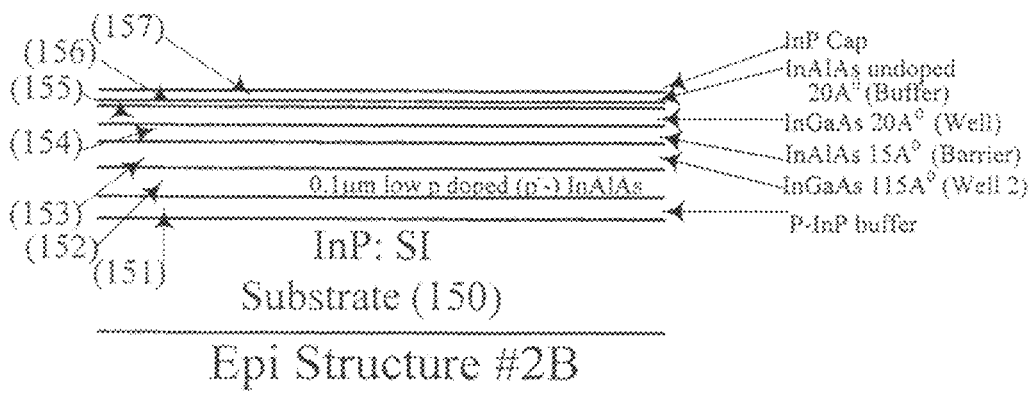
Fig. 7 (b) Cross-sectional schematic of asymmetric coupled well InGaAs-InP based floating SiOx-Si gate memory.

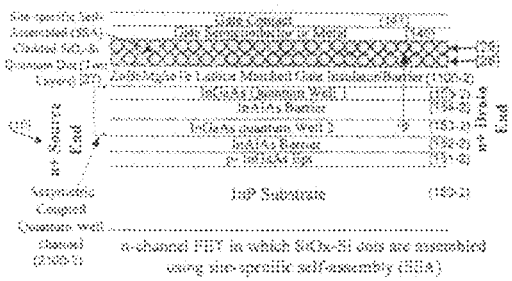

Fig. 11(a) An n-channel FET in which SiOx-Si quantum dots are assembled using site-specific self-assembly.

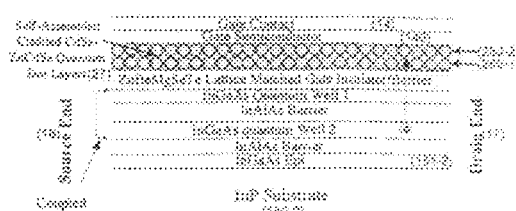

Fig. 11(b) A p-channel FET with cladded quantum dots assembled using layer-by-layer assembly [20].

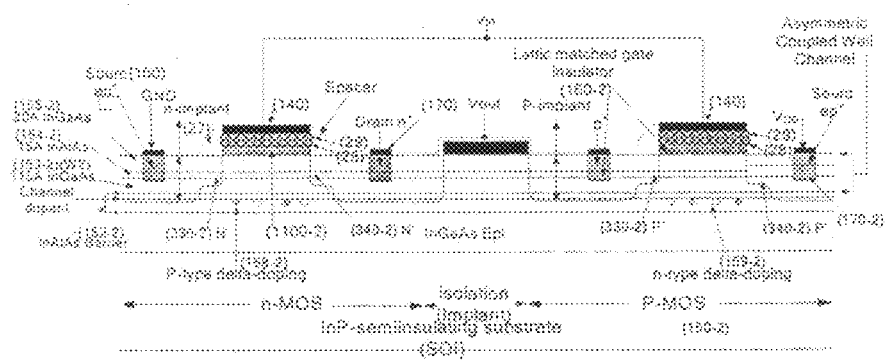

Fig. 11(c) Three-state n-channel and p-channel InGaAs-InP FETs in CMOS like configuration comprising of two layers of cladded SiO$_x$-Si quantum dots on InGaAs-InP layers. This is a semiconductor-on-insulator (SOI) structure.

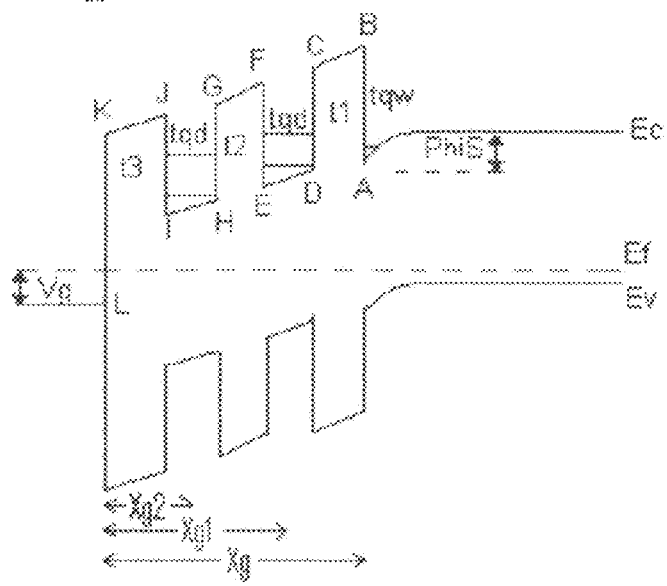
Fig. 12(a) Energy band diagram (not drawn to scale).
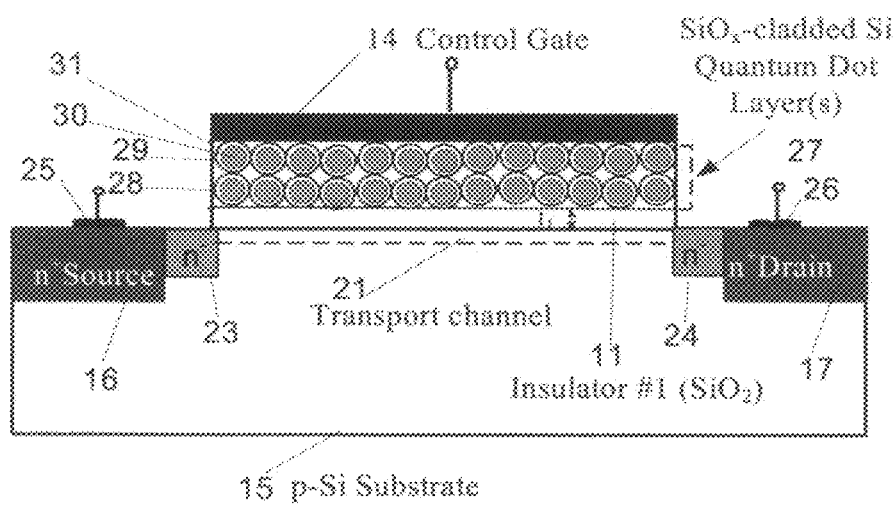
Fig. 12b. Schematic of two-layer QD gate FET 9Fig. 8a) shown sideways.

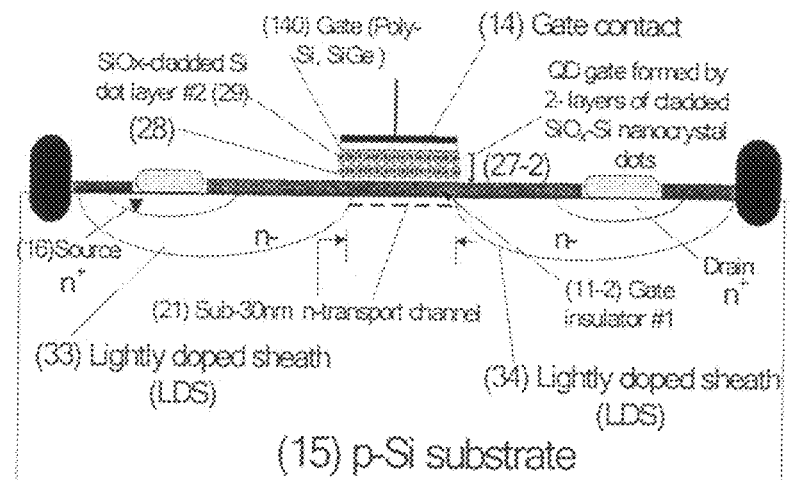
Fig. 13(a). An n-channel QD-gate nonvolatile structure where SiO$_x$-Si nanodots are deposited by Site-specific self-assembly (SSA) on the gate insulator#1. Gate insulator #2 is a conventional insulator layer under the control gate.
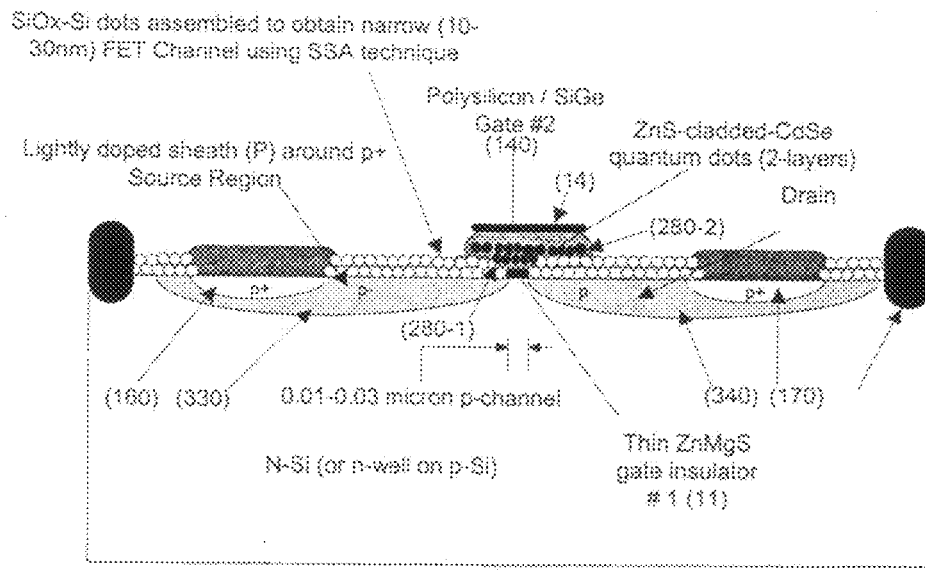
Fig. 13b. Cross-sectional schematic of a p-channel QD gate three-state FET structure employing cladded ZnS-CdSe quantum dots in the gate.

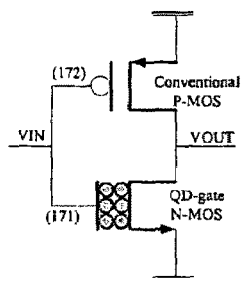 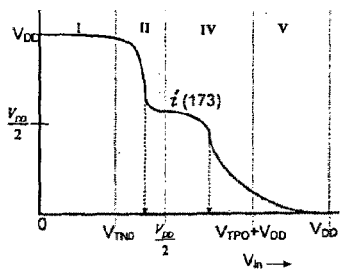 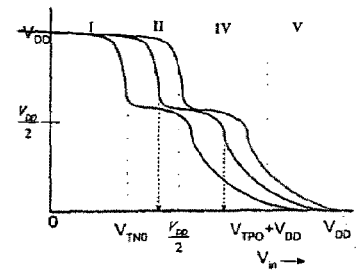
Fig. 14A QD-R CMOS inverter with QD n-FET & conventional p-FET.
Fig. 14B. Three-state Output-Input characteristic of the QD-R CMOS inverter.
Fig. 14C. Three-state Output-Input characteristic of the QD-R CMOS inverter.

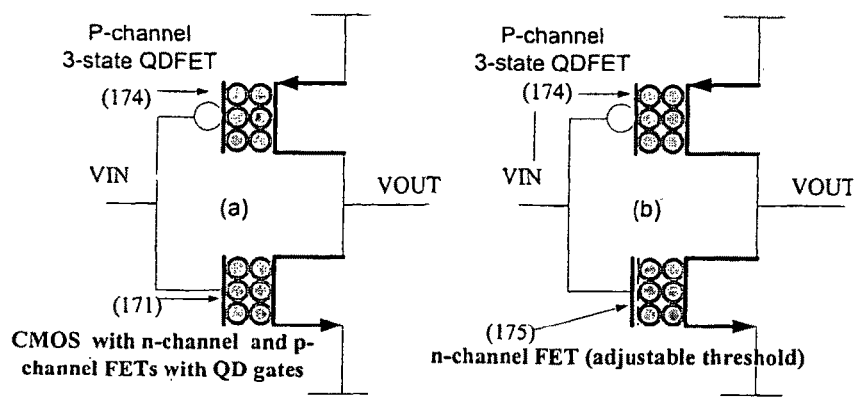
Fig. 15(a) Schematic of an inverter logic gate using both bistable QD FETs in CMOS configuration. Fig. 15(b) Schematic of a CMOS inverter logic gate using one bistable QD FET (p-channel) and one adjustable threshold n-channel FET.

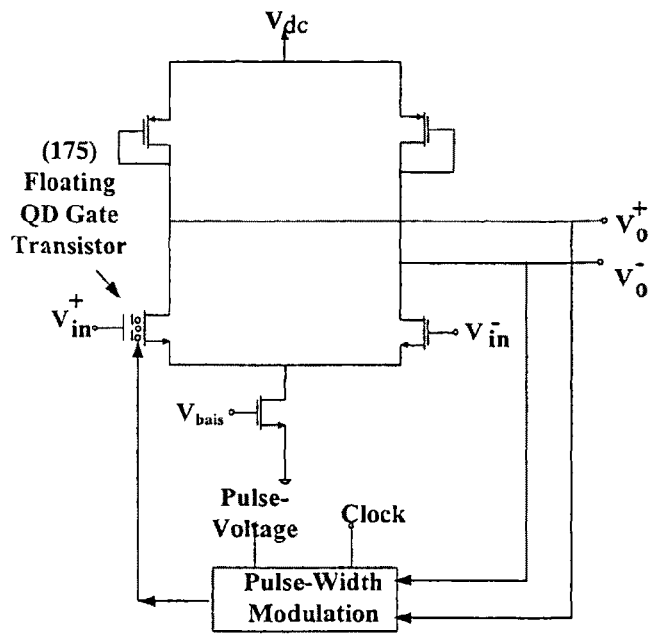
Fig. 16 (a) Schematic representation of threshold control of a FET with quantum dot floating gate to match the differential pair.

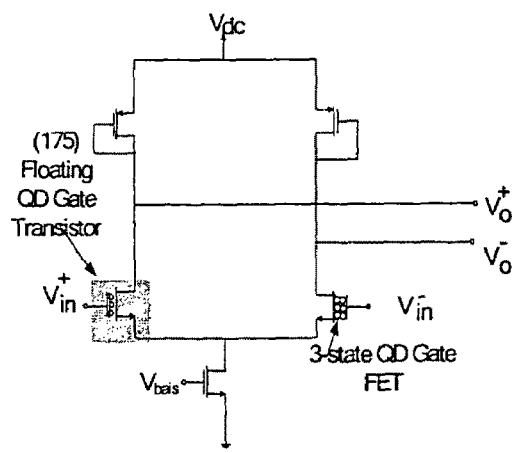
Fig. 16 (b) Schematic representation of a difference amplifier using a threshold voltage controlled FET with a three state quantum dot FET.

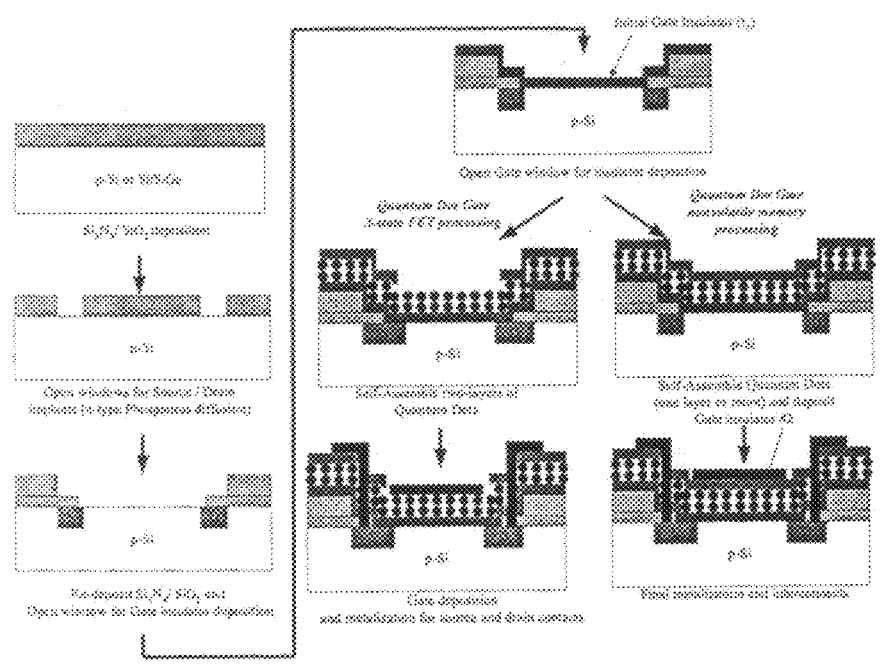

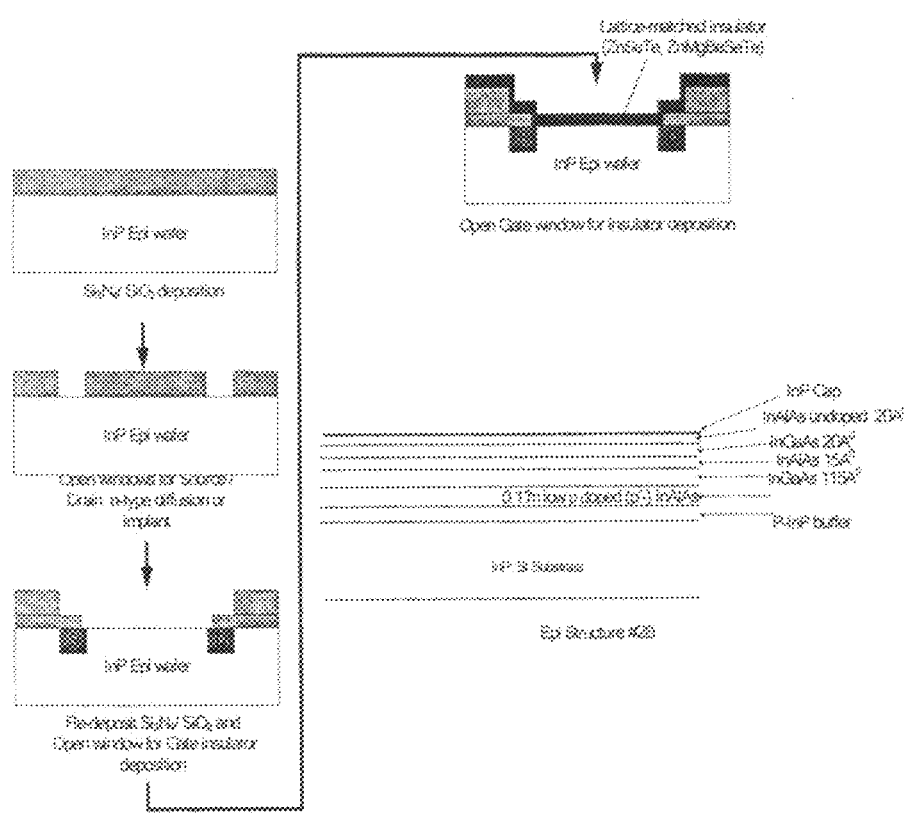

NONVOLATILE MEMORY AND THREE-STATE FETS USING CLADDED QUANTUM DOT GATE STRUCTURE

BACKGROUND OF THE INVENTION

1. Field of the Invention

This invention relates to field-effect transistors (FETs) and MOS (Metal Oxide Semiconductor) devices in which the gate consists of a layer or layer(s) of cladded nanoparticles or cladded quantum dots. Depending on the configuration of the gate layers consisting of cladded quantum dots and insulating layers, the structure behaves as fast access nonvolatile memory structure or as a FET exhibiting multiple states (such as three-state) in its drain current-gate voltage characteristics (also known as transfer characteristics). The three-state FETs can be used for various circuit applications including multi-valued logic gates with reduced device count for a given functionality or in the implementation of analog circuits. Another innovative feature is the use of an asymmetric coupled quantum well transport channel that enhances the retention time in a nonvolatile memory by increasing the 'effective' separation between channel charge (located in the lower quantum well) and the quantum dots in various layers of the floating gate storing a multiplicity of bits.

2. Brief Description of Prior Art

Nonvolatile memories are used to store information in microchips. Floating trap memory [realized as SONOS (Si-Oxide-Nitride-Oxide-Si) structures] and floating gate memories are two generally used configurations [Brown and Brewer (1998) and Cappelletti et al. (1999)]. Another important category is nonvolatile random access memories (NVRAMs) which are generally realized as magnetic RAMs (MRAMs), ferroelectric devices, SRAMs (static RAMs) with nonvolatile devices connected in parallel, and more recently carbon nanotube based memories (here the state of carbon nanotube depends on the gate operating conditions). These memory devices are continually being scaled down to smaller sizes (such as sub 100 nm) with fast access time and smaller operating voltages. FIGS. 1 and 2 show two commonly used nonvolatile memory structures. There are many variations.

Nonvolatile floating gate quantum dot memories (QDMs), shown in. FIG. 3a, represent another class of nonvolatile memories that are reported in the literature [Tiwari et al. 1995, 1996]. In quantum dot gate nonvolatile memories, the charge is discretely localized on the quantum dots, The charge distribution on the floating quantum dots is not continuous like conventional devices, and is determined by the tunneling of hot carriers at the drain end or from the channel. FIG. 3b shows a strained layer Si transport channel which is realized on SiGe layer [Hasannen et al, 2004]. This structure could also be realized in silicon-on-insulator (SOI) configuration. Ostraat et al. [2001] have reported floating gate memory structures using Si nanocrystals. They have summarized the advantages of nanocrystal based charge storage including: 1) reduced punch-through by reducing drain to floating gate coupling, 2) reduction in stress induced leakage currents, and 3) potentially enhanced retention times.

The QDMs have advantages of high-speed write/erase, scalability to sub-22 nm, and lower operating voltage over the conventional floating gate memories and floating trap or SONOS (Si-Oxide-Nitride-Oxide-Si) memories. However, the conventional QD based nonvolatile memory suffers from small retention time and fluctuations of electrical characteristics. In the current quantum dot gate device processing there is little control over the location of Si nanoparticles in the gate, their sizes, as well as the separation between them. Invariably, these dots are not cladded. Some reports outline forming cladding is in the literature after the dots are created. Here, they again suffer from the dot size variation problem.

What is needed is a nonvolatile memory device, which solves the above problems and which exhibits fast 'write' and 'access time' with desirable long 'retention time' for various applications. This is achieved, as described in this patent, by using cladded quantum dots (with appropriate core and cladding thicknesses) that are assembled or deposited on the transport channel of a FET forming the floating gate. In one embodiment, we describe the use of monodispersed $SiO_x$ cladded Si quantum dots constituting the floating gate layer. The cladding maintains a sufficient separation between Si nanodots, and between dots, transport channel and the control gate; thereby controlling the inter-dot tunneling and also improving the 'write and read' and the retention time characteristics. Self-assembled $SiO_x$—Si quantum dots also provide high dot density resulting in improved threshold shift and dual-bit cell 'read'. Deposition of mono-dispersed $SiO_x$—Si dots having dot size uniformity using site-specific self-assembly technique (which enables smaller deviation in size and dot placement) ensures smaller deviation in the device characteristics.

Another innovation pertains to the design of transport channel in which carriers flow between the source and drain. The transport channel is comprised of a coupled well structure, which has more than one wells and appropriate number of barrier layers forming the basic FET structure. An asymmetric coupled quantum well transport channel is formed when the two quantum wells are of different thicknesses and consist of a barrier layer between them. This structure enhances the retention time in a nonvolatile memory by increasing the 'effective' separation between channel charge (located in the lower well) and the nanodots located in the floating gate without significantly increasing the 'program' voltage for a given tunnel oxide thickness. In the case of FETs, coupled well are known to improve the high frequency operation [Jain and Heller (2002) and Heller et al. (1999)].

The usage of asymmetric coupled well transport channel structure along with cladded $SiO_x$—Si dot gate solves various challenging problems (mentioned above for QDM devices) particularly, in scaled-down FET-based memory structures. It provides additional control to limit the gate leakage current. In the case of nonvolatile memory, it enhances charge retention.

The three-state FETs which also use cladded quantum dots in the gate layers is a novel device described in this document. As a background of bistable devices, Kouklin et al. [2000] have reported bistable devices using self-assembled 10 nm CdS quantum dots using nanoporous anodic alumite films as the template. The three-state FET devices presented here are quite different from these conventional quantum dot structures reported in the literature. They are different from nonvolatile memory in a subtle way which is described in later sections of this document.

SUMMARY OF THE INVENTION

This invention describes insulator cladded semiconductor quantum dot gate devices, which function as nonvolatile memory structures and three-state field-effect transistors depending on the structure of the gate layers hosting cladded quantum dots. In the case of nonvolatile memory, the floating gate consists of at least one layer of cladded quantum dots, such as $SiO_x$-cladded Si nanocrystal. The cladded quantum dots are sandwiched between two layers of insulators of sufficient thickness which provides the desired charge retention and other characteristics. In the case of a three-state FET, at least two layers of cladded quantum dots are desired between the transport channel and the gate with appropriate insulator thickness (between the transport channel and the dots in the first layer) permitting charge transfer from channel to the two layer of cladded quantum dots and to the gate electrode for the functioning of the device. In an embodiment, the nonvolatile memory consists of two layers of cladded quantum dots with different core and cladding dimensions. No insulator layer may be needed when the top cladded QD layer has thicker $SiO_x$ layer. In another embodiment, more than two sets of cladded QD layers, separated by insulator and/or semiconductor layers, are also envisioned for the design and implementation of these devices with desired multi-bit storage characteristics.

Disclosed herein are device structures and method of fabricating cladded quantum dot gate nonvolatile memory and three-state FET devices that can be scaled down to sub-22 nm dimensions and embedded along side with other functional circuits in a distributed manner or in the form of arrays to implement versatile mixed signal (digital as well as analog) integrated circuits. Another innovation is the design of transport channel between the source and drain, which comprises of a coupled well channel comprising of two or more wells and appropriate number of barrier layers confining the charge carriers away from the gate insulator (or lattice-matched or pseudomorphic wide energy gap semiconductor) interface. An asymmetric coupled quantum well transport channel is formed when the lower quantum well is of different thickness than the upper well, thus localizing the channel carriers in the lower well. This structure enhances the retention time in nonvolatile memory by increasing the 'effective' separation between channel charge (located in the lower well) and the quantum dots located in the floating gate without significantly increasing the 'program' voltage for a given oxide or insulator thickness. The layer forming the lower well may be strained to further enhance the carrier mobility.

BRIEF DESCRIPTION OF FIGURES

FIG. 5(a) Cross-sectional schematic of conduction band of an asymmetric coupled well transport channel with strained Si wells and SiGe barrier layer realized on Si substrate layer with $SiO_2$ as the insulator #1.

FIG. 5(b) Cross-sectional schematic of a nonvolatile memory with two layers of cladded quantum dots and with details of layers forming the asymmetric coupled well (ACQ) transport channel.

FIG. 5(c1) Cross-sectional schematic of a nonvolatile memory with two sets of 2-layered cladded quantum dots separated by insulators and a thin semiconductor layer. Here, the p-poly semiconductor is introduced between the two insulators (2 and #3) to nucleate another set of dots (keeping in mind a particular processing technique known, as the site-specific self-assembly, SSA). Here the transport channel is an asymmetric coupled well structure. Even in SSA, the p-layer between the two sets of dots may not be needed depending on the dopings and layer thicknesses. Other technique such as layer-by-layer (Lee et al. 2001) may not require this p-layer for the deposition of second set of quantum dots.

FIG. 5(c2) Cross-sectional schematic of a nonvolatile memory with two sets of 2-layered cladded quantum dots separated by an insulator. This is when site-specific self assembly of SiOx-cladded Si nanocrystal dots can take place without requiring additional p-poly layer. Alternately, this is relevant when dot deposition is not site-specific.

FIG. 5(d) Cross-sectional schematic showing two layers of cladded quantum dots with second (top) layer with different construction than the first (bottom) layer. The top layer has a thicker cladding of $SiO_x$, thus there may be no need of having second layer of gate insulator below the gate (poly-Si/SiGe or metal).

FIG. 7(a). Cross-sectional schematic of an InGaAs—InP floating quantum dot gate nonvolatile memory with cladded $SiO_x$—Si nanocrystal dots self-assembled on a lattice-matched or pseudomorphic gate insulator. The floating gate consists of an array of quantum dots deposited on ZnMg-BeSeTe gate insulator. The second gate (control gate) serves as the external gate for the memory.

FIG. 7(b) Cross-sectional schematic of InGaAs—InP based floating $SiO_x$—Si quantum dot gate with asymmetric coupled well channel.

(a1) Cross-sectional schematic of a long channel FET with two-layers of $SiO_x$—Si quantum dots deposited on thin insulator above the transport channel.

(a2) Photograph of a fabricated QD-gate 3-state Si FETs.

(b) Experimental current-voltage ($I_D$-$V_D$) characteristics of a QD-gate FET. $I_D$ shows less increase and saturation as $V_G$ is increased to the intermediate state.

(c) Experimental drain current-gate voltage ($I_D$-$V_G$) transfer characteristic showing three-states.

(d) Three-states in $I_D$-$V_G$ characteristic of a long-channel FET (solid line experimental) and expected behavior with design changes (dashed line).

Figure 9:
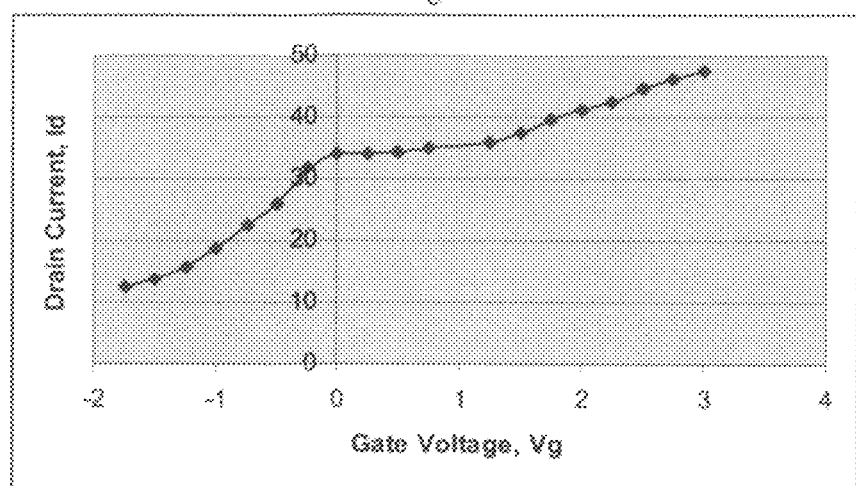

FIG. 9. Experimental transfer characteristic (drain current and gate voltage characteristic) of another (batch #2) three-state Si FET.

Figure 10:
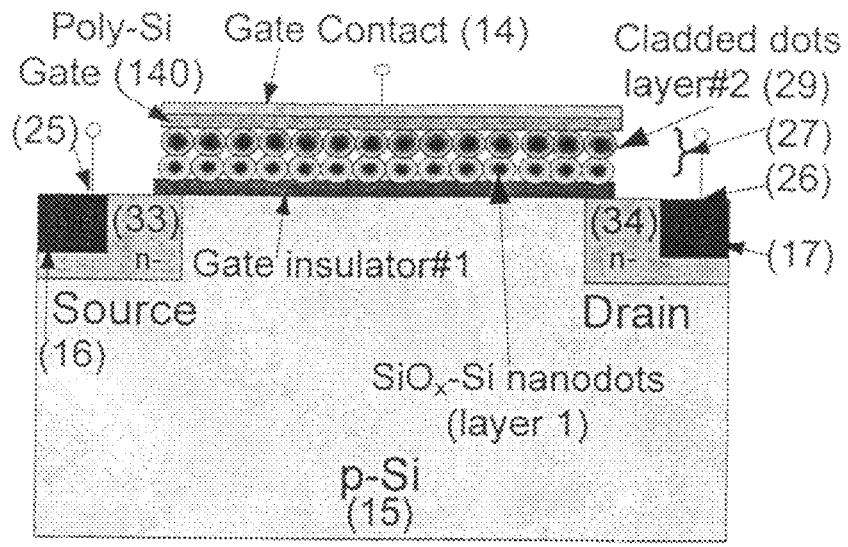

FIG. 10 (a). Cross-sectional schematic showing two layers of cladded quantum dots, each layer of $SiO_x$—Si cladded dots is different in terms of cladding thickness and Si core diameter. The FET structure is shown with source and drain extensions in LDS configuration.

FIG. 10 (b). Cross-sectional schematic showing two dissimilar layers of cladded quantum dots. Here, lightly doped drain (LDD) extensions [Taur and Ning, 1998] are shown around the source and drain. Halo structures around source and drain, typical to FETs, are not shown here.

FIG. 11 (a) Three-state field-effect transistor comprising of two layers of cladded $SiO_x$—Si quantum dots on InGaAs—InAlAs asymmetric coupled quantum well transport channel realized on InP substrate.

FIG. 11 (b) Three-state field-effect transistor comprising of two layers of cladded ZnCdSe—CdSe cladded quantum dots on InGaAs—InAlAs asymmetric coupled quantum well transport channel on InP substrate.

FIG. 11(c) Three-state n-channel and p-channel InGaAs—InP FETs in CMOS inverter configuration comprising of two layers of cladded $SiO_x$—Si quantum dots on InGaAs—InP layers. This is a semiconductor-on-insulator (SOI) structure.

Figure 8:
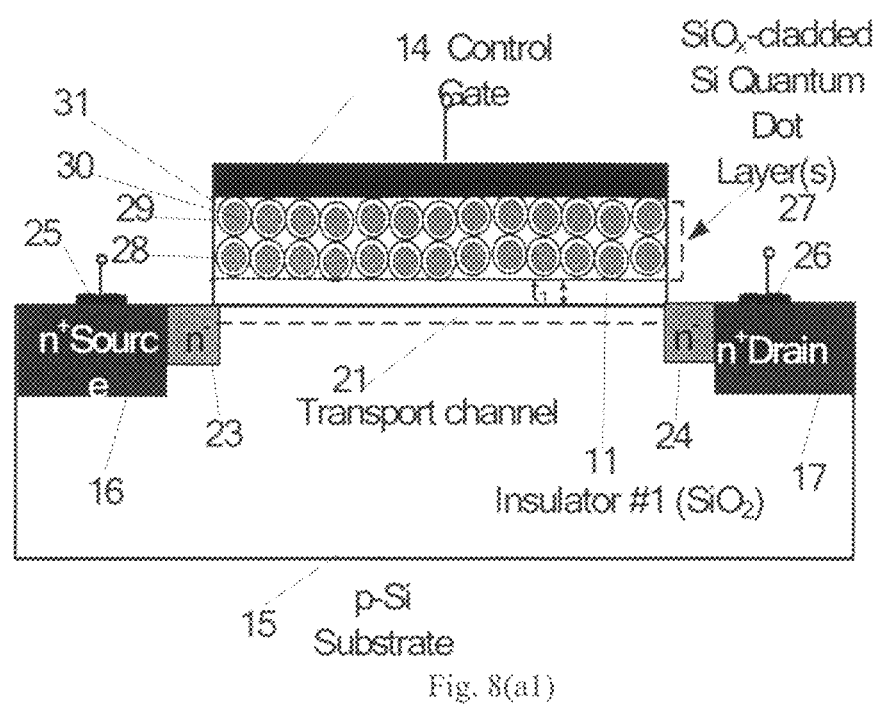
FIG. 8. Three-state field-effect transistor comprising of two layers of cladded quantum dots.
Figure 8:
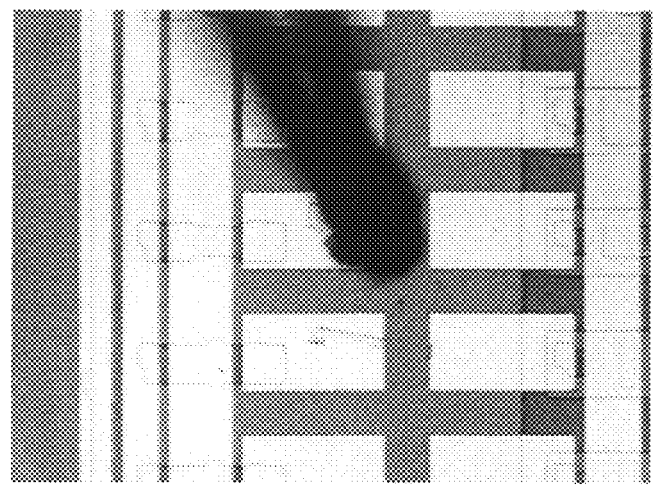

FIG. 12(a) Energy band diagram of two layers of $SiO_x$—Si quantum dots. FIG. 12 (b) Cross sectional schematic showing device (of FIG. 8a1) sideways for ease of comparison with the band diagram.

FIG. 13(a). An n-channel QD-gate 3-state FET structure where QD gate is formed by site-specific self-assembly (SSA) of $SiO_x$—Si nanodots on the gate insulator #1.

FIG. 13b. Cross-sectional schematic of a p-channel QD-gate three-state FET structure employing two or more layers of cladded ZnS—CdSe quantum dots in the gate. Here, $SiO_x$—Si dots are used to reduce the channel length of the p-FET.

FIG. 14. (A) QD-R CMOS inverter with QD n-FET with three-state behavior and a conventional p-FET. (b) Three-state Output-Input characteristic of the QD-R CMOS inverter. (c) Three-state Output-Input characteristic of the QD-R CMOS inverter showing intermediate state at different input voltages.

FIG. 15 Multi-state logic using both 3-state QD FETs in CMOS configuration.

FIG. 16 (a) Schematic representation of a differential pair (a circuit building block for analog circuits) in which the threshold voltage of a QD gate FET is controlled in order to match it with the other conventional FET. The mismatch may be due to process variation or other factors. FIG. 16 (b) Schematic representation of a difference amplifier using a threshold voltage controlled FET with a three-state quantum dot FET.

FIG. 17 (a) Schematic of a typical processing cycle used in the fabrication of a Si based QD-gate FET exhibiting three-states and a nonvolatile memory is described in terms of basic steps. The details may vary depending on the complexity of the scaling/size of the device.

FIG. 17(b) shows the schematic steps of a processing cycle for an InGaAs quantum well channel FET structure configured as a three-state device and a nonvolatile memory, respectively.

DETAILED DESCRIPTION

Figure 1:
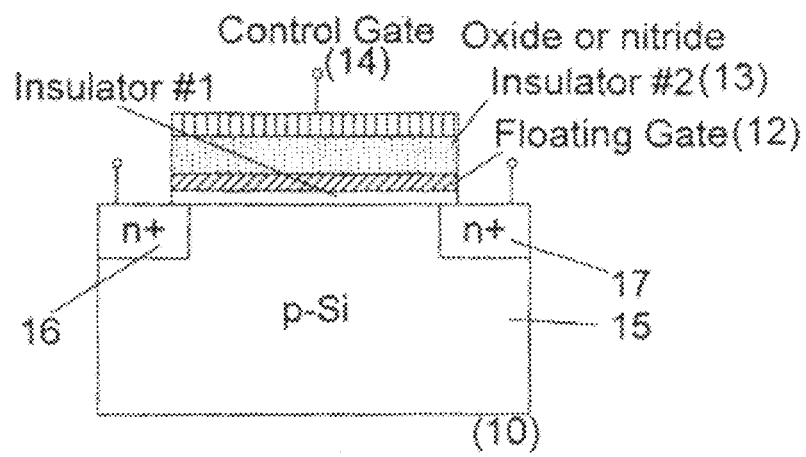
FIG. 1. Cross-sectional schematic of a conventional floating gate nonvolatile memory. Here the Si field-effect transistor (FET) has two gates. The first gate is the floating gate and the second gate serves as the control gate for the memory.

FIG. 1. Cross-sectional schematic of a conventional floating gate nonvolatile memory. Here the Si field-effect transistor (FET) has two gates. The first gate is the floating gate (12), which is deposited on a thin insulator layer (11), and holding the desired charge determining the state of the memory [0 or 1], and the second gate (14) serves as the control gate which is separated by an insulator layer (13) for the memory. The source (16): and drain (17) regions are shown as n+ regions in p-Si substrate (15). The control gate could be simple metal layer (14) or appropriately doped poly-Si layer (not shown here) with the metal contact layer.

Figure 2:
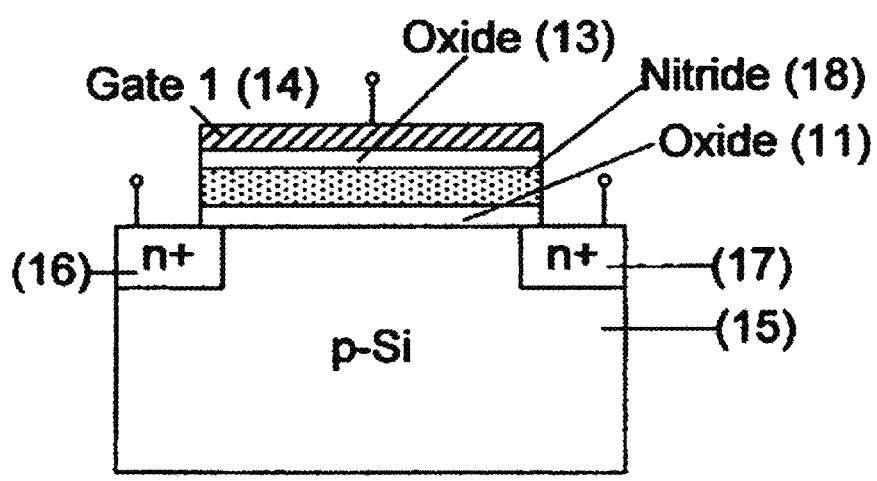
FIG. 2. Cross-sectional schematic of a conventional floating trap nonvolatile memory in SONOS [Si, oxide, nitride, oxide, poly-Si] configuration. Here the charge in the gate is trapped at the interface between nitride and $SiO_2$.

FIG. 2. Cross-sectional schematic of a conventional floating trap nonvolatile memory in SONOS [Si (15), oxide (11), nitride (18), oxide (13), poly-Si (not shown under gate metal 14 for simplicity)] configuration. Here the charge in the gate is trapped at the interface between nitride, $Si_3N_4$, (18) and gate insulator (11) $SiO_2$. The $Si_3N_4$ layer has another oxide layer (13) on top of it. The thicknesses of layer (13) and (11) may be different in floating gate and floating trap devices.

Figure 3A:
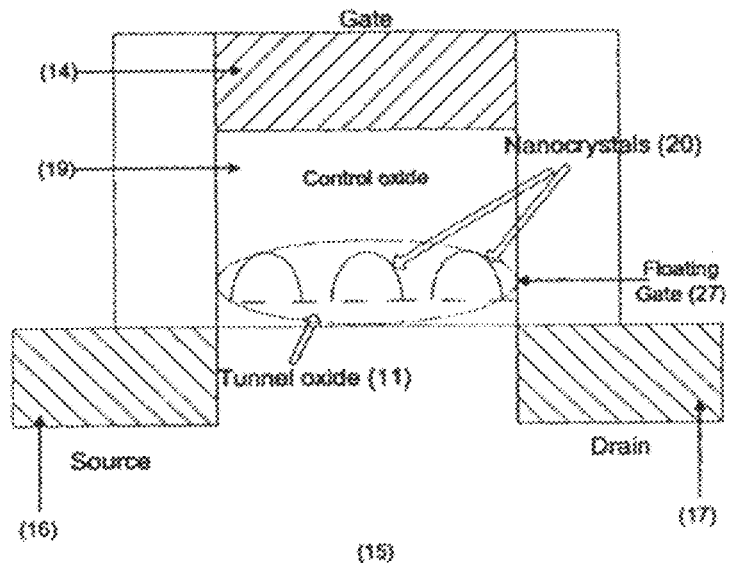
FIG. 3(a). A conventional floating quantum dot gate nonvolatile memory with Si nanocrystals as the floating gate layer deposited on $SiO_2$ insulator layer on top of the channel region.
Figure 3B:
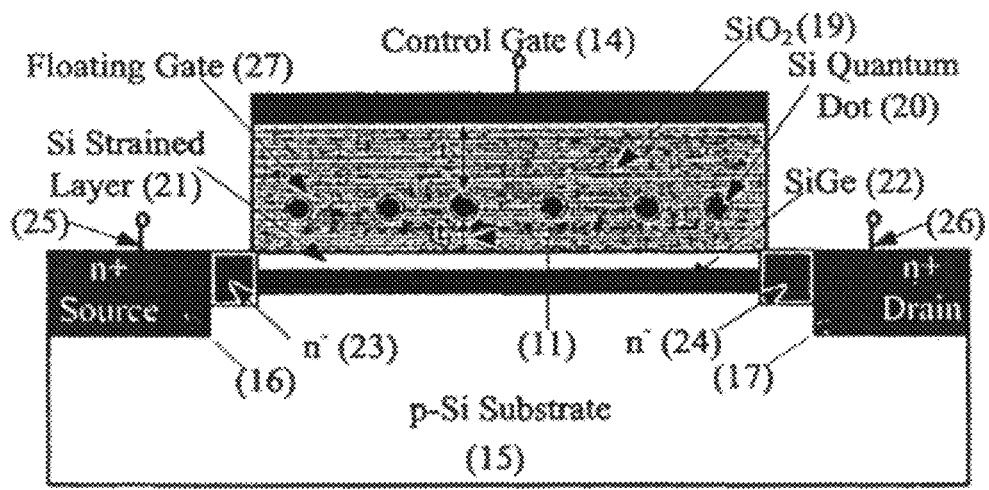
FIG. 3(b) shows a nanocrystal floating gate (27) memory with strained Si layer transport channel using SiGe layers in turn grown on p-type Si substrate. Here, the source and drain regions are shown in lightly-doped drain (LDD) configuration.
Figure 4A:
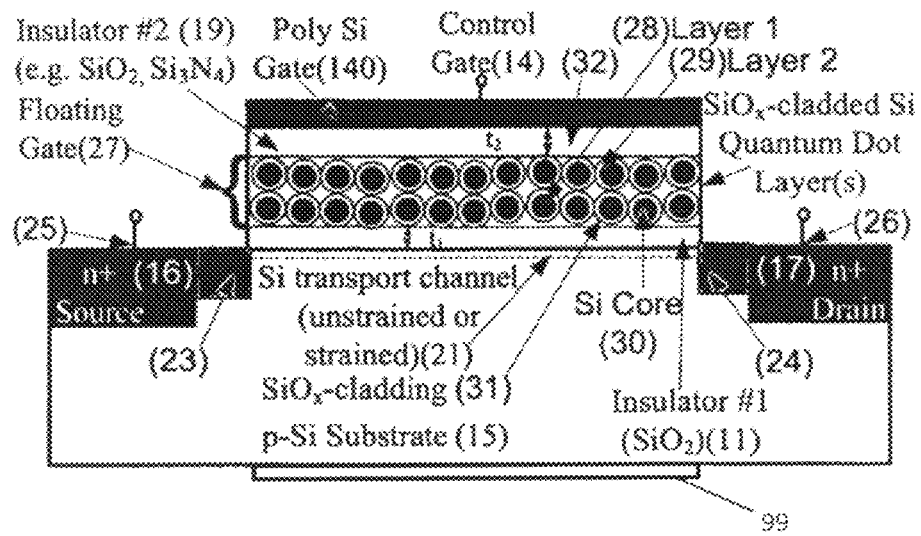
FIG. 4(a). Cross-sectional schematic of a floating quantum dot gate nonvolatile memory showing details of the cladded quantum dot layer(s). The floating gate is comprised of an array of cladded quantum dots which may be deposited by site-specific self-assembly (SSA) on the p-type transport channel region. The cladded $SiO_x$—Si nanocrystal dots, shown as two layers, are sandwiched between gate insulator #1 and the gate insulator #2. The second gate serves as the control gate for the memory. This structure is shown as a Si FET structure.

FIG. 3(a). A conventional floating quantum dot gate nonvolatile memory with Si nanocrystals (20) as the floating gate (27) layer deposited on $SiO_2$ insulator layer (11) on top of the channel region. On top of nanocrystals (20) another insulator layer (19) is deposited. The control gate is shown as layer (14). FIG. 3(b) shows a nanocrystal (20) floating gate (27) memory with strained Si layer (21) transport channel using SiGe layers (22) in turn grown on p-type Si substrate (15). Here, the source and drain regions are shown in lightly-doped drain (LDD) configuration with lightly doped source $n^-$ (23) and $n^-$ drain (24) adjacent to heavily doped ($n^+$) source (16) and drain (17). Strained Si layer (21) serves as the transport channel with higher mobility resulting in faster memory devices One embodiment of floating quantum dot gate nonvolatile memory, shown in FIG. 4 (a), comprises of $SiO_x$ cladded [~1-2 nm cladding thickness with cladding layer shown as (31)] Si nanoparticles [3-6 nm diameter, shown as (30)]. These cladded nanoparticles are called nanocomposites, cladded nanocrystals or cladded quantum dots. Unlike the conventional floating gate Si nanocrystal memory, where the dots are invariably organized by depositing a thin poly-Si film on an insulator such as $SiO_2$ (and the phase separation leads to the formation of Si nanocrystal dots which are of different size and located randomly), in one embodiment of this invention the quantum dots are of nearly uniformly-sized $SiO_x$-coated Si nanocrystals and are placed closed to each other. The cladded $SiO_x$—Si nanocrystal dots, shown as two layers (28 and 29), are sandwiched between gate insulator #1 (11) and the gate insulator #2 [(32) which is similar to layer (19) shown in FIG. 1]. One of these insulators (layer 11) interfaces with the transport channel (21), while the other dielectric [gate insulator 2 (32)] is in between the gate (14) and the cladded quantum dot layers (28, 29) forming collectively the floating gate (27). For example, a thin $SiO_2$ layer on Si could serve as the gate insulator #1 (11). Alternately, a high-κ insulator (hafnium aluminum oxide, $Si_3N_4$) or lattice-matched (L-M) wide energy gap semiconductor layer such as ZnMgS or ZnMgBeSe or ZnMgBeSSe or other combinations (providing sufficient energy barriers for charge carriers in the channel) can be used and the $SiO_x$—Si cladded quantum dots could be assembled or deposited on this layer. A second thin layer of insulator, serving as the control dielectric layer, could be deposited on the cladded dots. The thickness of $SiO_x$ cladding layer on Si nanocrystals or quantum dots determines the separation between dots. Finally, a poly-Si or SiGe gate semiconductor (140), providing the desired work function and flat band voltage $V_{FB}$ is deposited over it with an Ohmic gate contact (14). Alternatively, a metal gate could be deposited depending on the threshold voltage $V_{TH}$, channel length L, and scaling laws defining the FET structure. $SiO_x$—Si cladded quantum dots form the floating gate (27).

In practice these dots serve both as floating gate as well as floating trap memory gate. The charges are trapped at the interface of $SiO_x$ cladding and Si core of these cladded dots. This is a novel feature of these cladded quantum dot based devices. The magnitude of the trapped charges determines the state of the memory or the operation of the three-state FETs. This is in contrast to the conventional floating trap [poly Si-oxide-nitride-oxide (SONOS) where SiN-Oxide interfaces host traps] and floating gate structures. The characteristic of SONOS traps is quite different than the traps or states at the $SiO_x$—Si quantum dot interfaces.

The dots are monodispersed and are placed using a site-specific self-assembly technique [Jain and Papadimitrakopoulos, 2006] In this method, the $SiO_x$—Si dots get deposited on p-Si region and over thin insulator (11) between the source (23, 16) and drain (24, 17). Alternatively, the dots can be deposited by other methods including layer-by-layer assembly [Lee et al. 2001]. Our approach using the cladded nanocrystal dots solves the problem of retention as well as fluctuation in device characteristics due to dot. size variation, their placement, and inter-dot separation uncertainty.

Fabrication methodology, which can accomplish device fabrication in a manner compatible with current Si integrated circuit processing, is also described briefly in later sections (see FIG. 17).

Figure 4B:
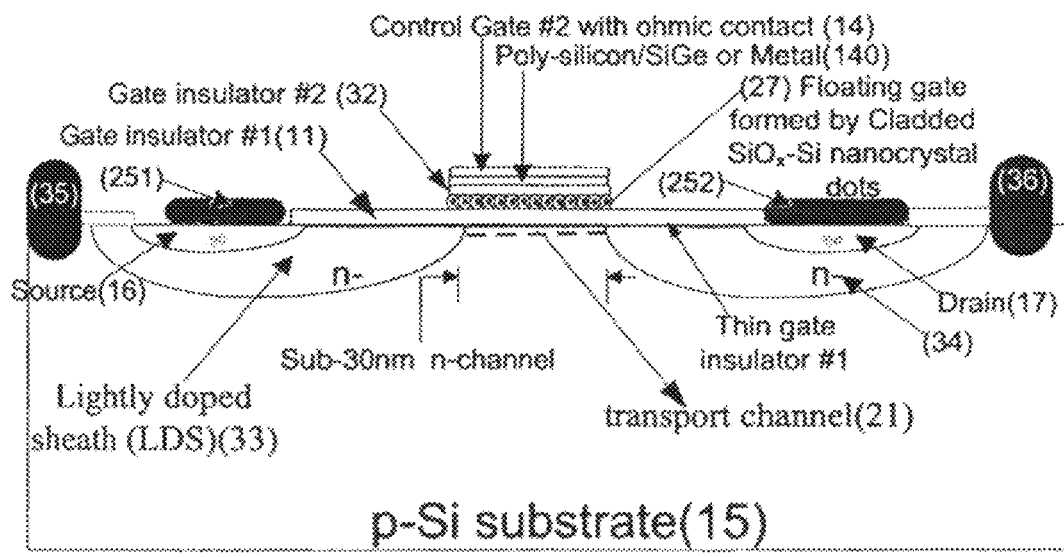
FIG. 4(b) shows the details of source and drain regions which utilize lightly-doped sheath (LDS) [Jain, 1990] around the n+ source and drain regions. The structure is specially suited for CMOS sub-22 nm devices. Here, one layer of cladded quantum dots is shown between two insulators. In this figure, the $SiO_x$—Si quantum dots are self-assembled on insulator #1. In one embodiment, the quantum dots are deposited on the negative space charge region hosted in the p-semiconductor region under the gate under inversion or depletion. There may be other materials for cladded dots such as ZnS—CdSe which may be deposited using other technique such as layer-by-layer methodology [Lee et al. 2001].

FIG. 4(*b*) shows the details of source and drain regions which utilize lightly-doped sheath (LDS) regions (33) and (34) [Jain, 1990] around the n+ source (16) and drain (17) regions, respectively. The structure is specially suited for CMOS sub-22 nm devices. Other source and drain structures or FET configurations [such as in FinFETs, Yu et al. (2002)] can be used. Here, one layer of cladded quantum dots is shown between two insulators. In this figure, the $SiO_x$—Si quantum dots [shown as only one layer (27)] are self-assembled on insulator #1 (11). In one embodiment, the quantum dots are deposited using site-specific self-assembly which preferentially deposits on the negative space charge region hosted in the p-semiconductor region between source and drains. There may be other materials for cladded dots such as ZnS—CdSe which may be deposited using other technique such as layer-by-layer methodology.

Other FET structures such as FINFETs or dual or double gate FETs [Huang et al. 2003] can be configured as floating QD-gate nonvolatile memory devices.

Another innovative feature pertains to the coupled-well transport channel in the basic FET structure. In FIG. 3(*b*) we showed a strained Si layer (21) grown over SiGe layer (22) as the transport channel in which electrons flow in the inversion channel [formed at the Si interface with insulator layer (11)]. The asymmetric coupled quantum well design of FIG. 5(*a*) is such that electrons flow in the lower quantum well (39). This enhances the retention time of the memory by increasing the 'effective' separation between inversion channel (hosting electron charge layer (located in the lower well) and the nanodots without increasing the 'program' voltage for a given gate insulator layer and its thickness. FIG. 5(*a*) shows various layers forming the asymmetric coupled-quantum well serving as carrier transport channel. It is comprising of Si Well #1 (37) which is below the gate insulator $SiO_2$ #1 (layer 11), SiGe barrier layer (38, separating the two quantum wells), Si Well #2 (39), and SiGe barrier (40), and unstrained SiGe layer (41) which is grown on p-Si substrate (15). There may be various combination of these and other materials to accomplish this coupled-well structure. An energy band diagram (conduction band) along with the location of channel electron wavefunction (dashed line) for the Si—SiGe asymmetric coupled well transport channel (realized using strained Si wells and SiGe barrier layer on Si substrate) is shown. In another embodiment, these layers can be realized in silicon-on-insulator (SOI) configuration using partially depleted or fully depleted FET channel design configuration. In addition, other structural arrangements are reported in the literature to realize strain in the transport channel.

The details of the memory device with QD gate (27) and coupled well channel (210) are also shown in FIG. 5(*b*) without explicitly showing the source and drain regions (as shown in FIG. 4). However, it should be appreciated that a back gate 99 may be included to facilitate additional bit manipulation.

In one embodiment, the quantum wells are realized by Si or SiGe layers and the barriers adjacent to these are lattice-matched wide energy gap or pseudomorphic layer comprising of ZnS, ZnMgS, ZnMgBeS, ZnMgBeSSe. Here, the use of pseudomorphic wide energy gap semiconductor or insulator minimizes the surface states at the interface.

The asymmetric coupled well (transport channel) memory structure in conjunction with the incorporation of cladded $SiO_x$—Si dot in the floating gate solves two challenging problems facing nanocrystal nonvolatile or flash memories: (a) charge retention and (b) fluctuation of program-erase characteristics. This is achieved by: (1) maintaining sufficient inter-dot separation via $SiO_x$ cladding, thereby reducing inter-dot tunneling and improving retention time, (2) providing high dot density (resulting in improved threshold shift, adjustable threshold voltage, and dual-bit cell 'read'), and (3) dot size uniformity via assembly of mono-dispersed $SiO_x$—Si dots (manifesting smaller deviation in the device characteristics).

In another embodiment of the cladded quantum dot memory is shown in FIG. 5(*c*1). Here, two sets [set #1 (27), and set #2 (46) of $SiO_x$-cladded Si quantum dot (each consisting of two layers (28 and 29 in set 1) and (47 and 48 in set #2)] are shown. These sets of 2-layer QDs are separated by a thin insulator (43). Layer 46 ($2^{nd}$ set of quantum dots) has another insulator #4 (layer 49) which has a metal gate (14) on top of it (depending on the FET design). In addition in some QD deposition methods, a thin p-semiconductor layer (44) is needed. For example, this is done in site-specific self-assembly, SSA, technique (which requires p-semiconductor to assemble site-specific layers if the space charge in the substrate is not adequate). This thin semiconductor layer may not be needed in alternate processing methodology for the $2^{nd}$ set of QDs.

A variation of FIG. 5c1 is in FIG. 5c2. In FIG. 5c2, the second set (46) of QD layers are deposited on the gate insulator 2 (43) without having p-poly semiconductor (44) and insulator #3 (45). This structure is possible by layer-by-layer self-assembly or even by site-specific self-assembly (where the depletion charge density in the p-substrate is adequate). The structure of FIG. 5c2 is shown with poly-Si (or SiGe or Ge) gate (140) with a contact layer (14).

The structures of FIG. 5(c1) and FIG. 5c2 can serve as multi-bit storage nonvolatile memory. Here, the charging of second set of quantum dots is envisioned by the manipulation of the control gate voltage during the 'Write' cycle. The location of charge on first set of dots or on the second set of cladded dots determines the "state" of the memory cell. Each state is associated with a different threshold voltage (and capacitance) values. This property can be used to realize a multiple-state/multi-bit QD-gate nonvolatile memory.

Placing charge on dots, located in a certain selected spatial location (say near the drain end or near the source end) can also be achieved by using asymmetric source and drain extensions (as used in conventional nonvolatile memories [references: Brown and J. Brewer, 1998; Cappelletti et al., 1999].

In the case of 1-transistor-1-capacitor dynamic RAM (DRAM) type cell [Kang and Y. Leblebici, 2003], QD device can serve as a programmable capacitor where the capacitor value is determined by the location of the charge (whether it is on the first set of quantum dots or the second set of quantum dots). It can also be configured as a single transistor nonvolatile Random Access Memory (RAM) where one transistor serves as the access device as well as charge storage, and refreshing is not needed. However, an appropriate circuit methodology to sense the state is required.

Alternately, QD gate FETs can be employed in conventional static RAM (SRAM) cells where the state is stored in a nonvolatile manner as the state of the floating QD-gate transistor. The speed of operation is determined by the 'Write' and 'Erase' times.

Still in another embodiment is shown in FIG. 5(d). Here, the second QD layer (290) of the $SiO_x$—Si quantum dots has a $SiO_x$ cladding that is thicker than in bottom dots (280). The thickness of cladding (310) may be enough to serve as the gate dielectric/insulator layer #2 (32 in FIG. 5b), controlling charge transfer to the (top) control gate (14). This may be accomplished either during deposition or self-assembly or post processing following QD deposition where the outer layer may further oxidized to increase the cladding layer (310) thickness at the expense of core (300). One method to achieve this may be to heating selectively in an oxidizing ambient the top Si dots (e.g. using rapid thermal annealing, RTA).

Figure 6A:
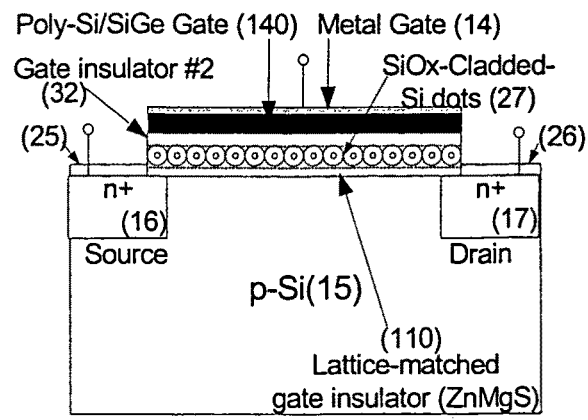
FIG. 6(a). Cross-sectional schematic of a Si floating quantum dot gate nonvolatile memory with cladded $SiO_x$—Si nanocrystal dots self-assembled on a pseudomorphic or lattice-matched gate insulator such as ZnMgS, ZnBeMgS with appropriate energy gap providing sufficient energy barrier for carriers in the transport channel. The floating gate consists of an array of cladded $SiO_x$—Si quantum dots and the second gate shown as poly-Si/SiGe serves as the control gate for the memory. The basic FET is shown in Si compatible material system.

FIG. 6(a). Cross-sectional schematic of a floating quantum dot gate nonvolatile memory with $SiO_x$-cladded Si nanocrystal dots self-assembled on a lattice-matched gate insulator layer (110) comprising wider energy gap material such as ZnMgS, ZnBeMgS with appropriate energy gap providing sufficient energy barrier for carriers in the transport channel. The lattice constant of the insulator layer (ZnMgS or ZnBeMgS or ZnBeMgSSe) could be slightly different (with in the limits of being pseudomorphic) than that of Si substrate (15). In case the inversion or transport channel is made of other material, the lattice constant should be pseudomorphic with the quantum wells. The floating gate (27) consists of an array of cladded $SiO_x$—Si quantum dots deposited on ZnMgS gate insulator (110). The second gate, deposited on insulator layer (32), shown as poly-Si/SiGe (140) serves as the control gate for the memory. The insulator (32) between the dots and the poly-Si gate may be SiN, SiON or a high-K material. The basic FET is shown in Si material system.

Figure 6B:
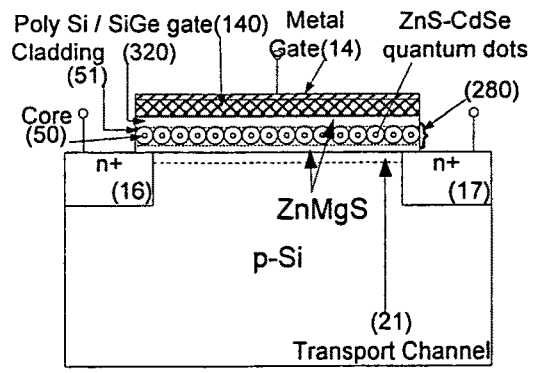
FIG. 6(b). Cross-sectional schematic of a Si floating quantum dot gate nonvolatile memory with cladded ZnS—CdSe dots sandwiched between two wide energy gap layers of lattice-matched or pseudomorphic energy barriers serving as insulator #1 and insulator #2.

FIG. 6(b). Cross-sectional schematic of a nonvolatile memory with ZnS-cladded CdSe quantum dot layer forming the floating gate (280), sandwiched between two wide energy gap layers of ZnMgS serving as the insulator #1 (110) and insulator #2 (320). Layer 140 is the semiconductor gate layer comprising of poly-Si, poly-SiGe for appropriate threshold voltage characteristics of the FET and the memory. Layer (14) is the metallic contact. Alternatively, metal layer 14 alone could be used. The insulator (110) is lattice-matched or pseudomorphic to the transport channel (21). The insulator layers [(110) and (320)] are selected so that they provide adequate energy barriers for carriers in the transport channel and carriers located in the floating gate. The cladded quantum dot comprise of cladding-core combination selected from ZnS—ZnCdSe, ZnSSe—CdSe, ZnBeMgS—GaP, ZnBeS—GaAsP. The core (50) and cladding (51) combination are matched to the insulator (110). Source (16) and drain (17) are like other devices discussed before. They could be formatted in LDS or LDD format.

Figure 6C:
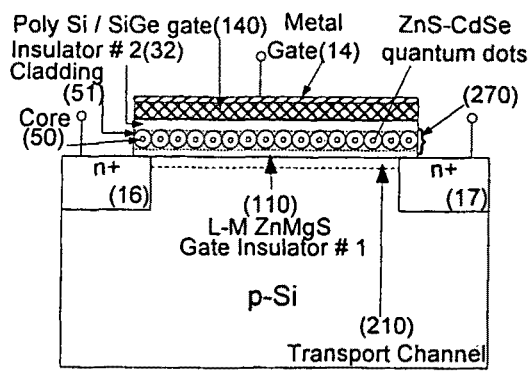
FIG. 6(c) shows a variation on FIG. 6(b) where insulator #1 is pseudomorphic or lattice-matched and the other insulator could be any type of high energy gap insulator (e.g. $SiO_2$, SiN etc).

Other combination of cladding and core material system comprising of GaN-InGaN, GaP—Si, InAlAs—InGaAs forming cladded quantum dot materials can be deposited on insulator #1 (110). Insulator (110) is grown in a lattice-matched or pseudomorphic format over the substrate. FIG. 6(c) shows a variation on FIG. 6(b) where insulator #1 (110) is Lattice-Matched (L-M) or pseudomorphic to the transport channel while the other is comprised of any type of high energy gap insulator (e.g. SiN, $SiO_2$, etc).

Figure 6D:
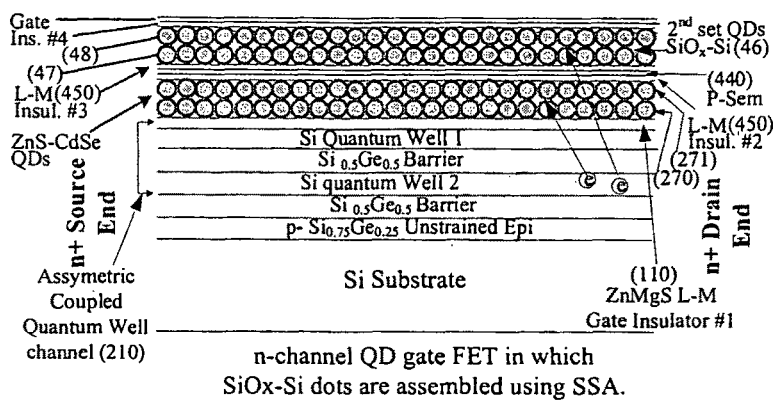
FIG. 6(d) shows two sets of different quantum dot layers, with lattice-matched or pseudomorphic gate insulator #1, lattice-matched insulator layers 2 and 3 sandwiching a p-semiconductor. The p-semiconductor is used to self-assemble second set of $SiO_x$—Si quantum dots using site-specific self-assembly (SSA) technique. This is similar to FIG. 5(c) in concept.

FIG. 6(d) shows two sets of different quantum dot layers that are similar to FIG. 5 c. Here the difference is that $1^{st}$ set of quantum dots are ZnS—CdSe type (270 and 271), as described in FIG. 6b. This set of two cladded layers (as shown or one cladded layer) are lattice-matched or pseudomorphic [see reference Jain and Papadimitrakopoulos, 2006]) to the gate insulator #1 (110). In some cases non-matched dots such as ZnS—CdSe may be desirable (such as in floating trap type). The insulator layer 2 (320), insulator layer 3 (450, analogous to layer 45 in FIG. 5c1), and p-semiconductor [(440) which is needed to deposit $2^{nd}$ set of $SiO_x$—Si quantum dots (46) using site-specific self-assembly (SSA) technique. Here, the transport channel is of asymmetric coupled well type as shown in FIGS. 5(c1 and c2). This can also be realized with the p-semiconductor layer (440) and insulator #3 (450).

FIG. 7(a). Cross-sectional schematic of a floating quantum dot gate nonvolatile memory with cladded $SiO_x$—Si -nanocrystal dots self-assembled on a lattice-matched gate insulator [(1100), comprising of ZnSeTe, ZnMgSeTe, ZnBeMgSeTe and other wide energy gap semiconductors] grown on InGaAs layer as the transport channel or coupled quantum well transport channel (210) which are grown on InP substrate (150). The floating gate (27) consists of one (28) or more layers of arrays of $SiO_x$-cladded Si quantum dots deposited on ZnMgBeSeTe gate insulator. The second gate 14 (control gate) serves as the external gate which is deposited on second insulator (32) (like Si nonvolatile memory FETs). Variations of structures in InGaAs—InP or InGaAs-GaAs or InGaN-GaN or other material combinations, similar to those described in FIGS. 5 and 6, may be envisioned for high speed and or high temperature operation considerations or applications.

FIG. 7(b) Cross-sectional schematic of InGaAs—InP based floating $SiO_x$—Si quantum dot gate with asymmetric coupled well channel. Except for the difference of the material system, the construction of the transport channel is similar to the Si FET memory device of FIG. 5b. Starting from the InP substrate 150 (which may be semi-insulating (SI) like SOI [Takagi et al. 2003]) or regular FET structure with p-type InP. In this figure, a semiinsulating substrate is used. There is a buffer layer of p-InP (151, for n-channel FET). This is followed by an p-InAlAs layer (152) which in a way serves as an outer barrier to the InGaAs quantum well #2 (153). On top of this layer, there is InAlAs barrier (154), another quantum well #1 (155), another barrier (156) which is optional. The InP cap layer (157) is removed before the deposition of ZnSeTe lattice-matched or pseudomorphic insulator (1100, see FIG. 7a). The primary criterion for the lattice matched or pseudomorphic layer 1100 is to provide adequate barrier in the conduction band (AE.) for the electrons (in well #2, layer 153). That is, electron in the transport channel should be transferred at the desired drain voltage and gate voltage combination, in order to perform a "Write" operation.

Figure 8B:
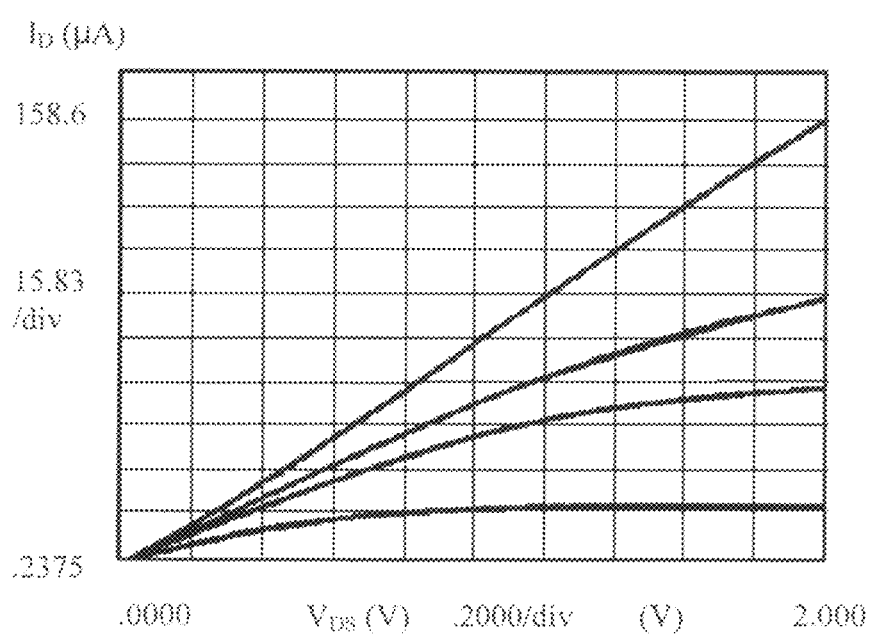
Figure 8C:
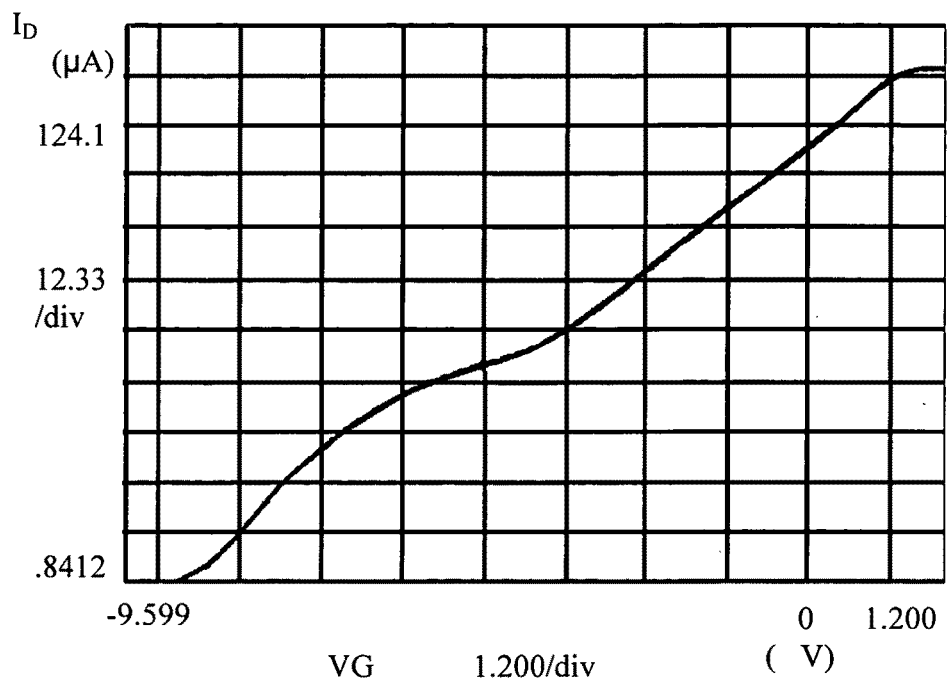
Figure 8D:
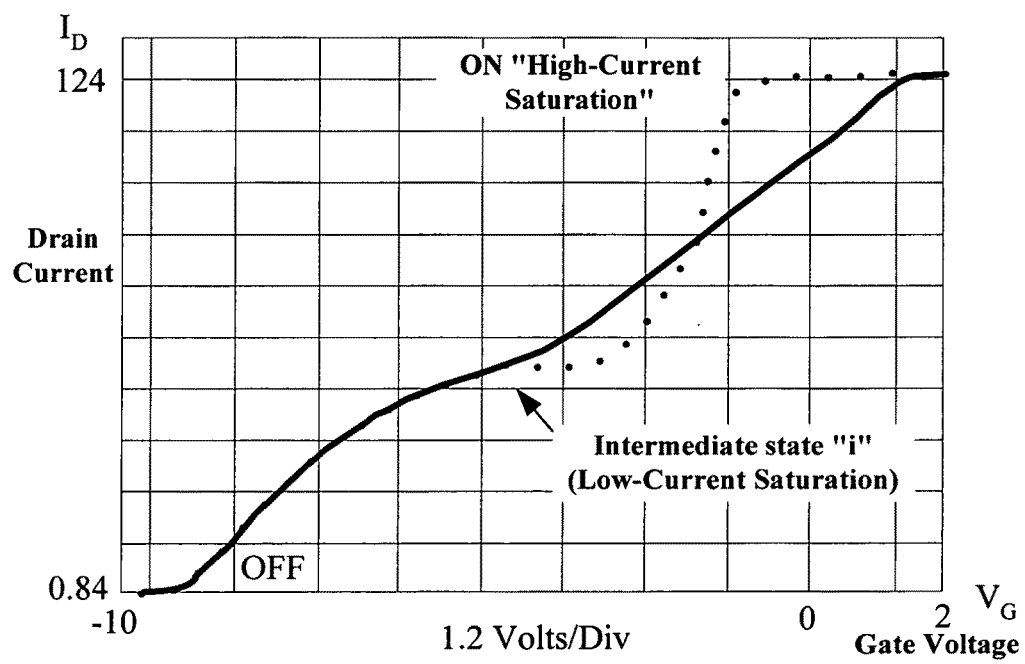

FIG. 8a1 describes a novel three-state Si FET comprising of at least two layers (28 and 29) of $SiO_x$-cladded (31) Si (30) quantum dots deposited on thin gate insulator layer (11) which is on top of the transport channel (21) formed between source ($n^-$ extension 23, and $n^+$ region 16) and drain ($n^-$ extension 24, and n+ region 17) regions. The thin insulator layer (11) serving as a barrier layer. Unlike nonvolatile memory structure of FIG. 4(a), there is no intentional insulator layer #2 (19) between the gate (14) and the two layers comprising of $SiO_x$-cladded Si dots (27 representing 2 layers of cladded dots). The combination of thickness of thin insulator layer (11), $SiO_x$ cladding (~1-2 nm) around Si dots, Si dot sizes (~4-6 nm), and having at least two layers of cladded dots is critical to the manifestation of the 3-state behavior (shown in FIG. 8c). Increasing the thickness of insulator #1 (11) above a certain value will reduce the range of intermediate state 'i' in the transfer characteristics. FIG. 8a2 shows a photograph of a fabricated device. These QD-gate FET structures exhibit novel 3-state current-voltage ($I_D$-$V_D$) input-output (FIG. 8b) and transfer characteristics (FIG. 8c). FIG. 8(d) shows experimental 3-state transfer characteristics along with optimized 3-state behavior (dashed line) of a QD-gate FET. The characteristics of the intermediate state can be optimized by adjusting the cladding and core thicknesses, the thickness of the insulator layer under the cladded dots, as well as the parameters of the transport channel and associated electrical behavior including threshold voltage of the FET structure.

In one embodiment of three-state FETs, $SiO_x$-coated-Si nanoparticles are deposited as at least two layers between a gate electrode (14) and thin gate insulator (11). The gate insulator could be $SiO_2$ of appropriate thickness, commensurate to the device design rules for the particular channel length selected. Multi-state FETs can be used as logic gates that facilitate advanced circuit design and reduced device count in circuits.

CMOS logic gates realized using QD-gate FETs (with the additional intermediate state) results in three-state input-output characteristics [see FIG. 14]. This enables implementation of multiple-valued logic (MVL), resulting in significantly reduced FET counts in digital and analog circuits.

QD-gates also permit trimming of FET characteristics to match transistor pairs in analog circuits or to realize comparators.

The novel intermediate state "i" in the output ($I_D$-$V_D$) and transfer ($I_D$-$V_G$) characteristics was experimentally observed while fabricating QD-gate ($SiO_x$-coated-Si nanocrystal) nonvolatile memory without an intentional insulator layer over the cladded quantum dots deposited using site-specific self-assembly technique. This behavior is evident in the transfer characteristic [FIG. 8(c) and FIG. 9; two different samples from different batches] which show three distinct stable states:

(1) OFF state or "0" below threshold,
(2) Intermediate "i" or Low-Current Saturation State which is manifested over a range of gate voltage, and
(3) ON state or "1" "High-Current" Saturation State that exists above a certain value of $V_G$. Of these, "0" and "1" are common to conventional FETs.

In another embodiment, asymmetric or symmetric coupled well channel can be integrated. The asymmetric coupled well channel will be similar to that shown in FIG. 5.

Still in another embodiment, Silicon-on-Insulator (SOI) structures may be configured as 3-state FETs either in fully depleted or partially depleted formats. In addition, gates of FINFETs can be configured as QD gates. Thus, formation of QD-gate exhibiting 3-state behavior is generic and can be integrated or employed in a variety of FET structures.

FIG. 9 shows the transfer drain current-gate voltage characteristic of long-channel device (another batch of fabricated devices) using the mask similar to that used for FIG. 8a2. This device shows and intermediate state 'i' which shows little variation in drain current $I_d$ when the gate voltage $V_g$ is varied between 0 and 1.0 Volt. FETs with specific intermediate state can be designed by adjusting the cladding (31) and Si core (30) thicknesses, the insulator layer (11) thickness and material (e.g. $SiO_2$, ZnMgS) under the cladded dots, as well as the construction of gate material over the dots.

Figure 10B:
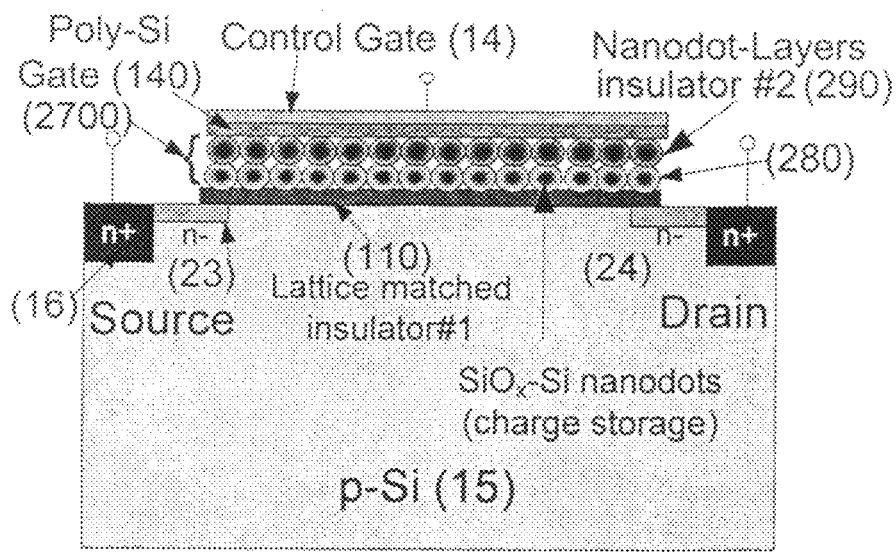

FIGS. 10(a) and 10(b) show two structures having two layers of cladded quantum dots. Each layer has a set of cladded quantum dots that are different for those in the other layer. The structures differ in the source and drain formats.

FIG. 10(a) integrates a lightly-doped sheath (LDS) design with source ($n^-$ extension 33, and n+ region 16) and drain ($n^-$ extension 34, and $n^+$ region 17) regions. The gate layer (140) is comprised of poly-Si, poly-SiGe, or other layers providing the desired flatband behavior, and is formed on top of the cladded QD layer #2 (29). The gate contact layer over (140) is shown as (14).

FIG. 10(b) illustrates standard lightly doped drain (LDD) extensions for source ($n^-$ extension 23, and $n^+$ region 16) and drain ($n^-$ extension 24, and $n^+$ region 17) regions. Here, halo regions around source and drains are not shown. The metal gate (14) comprising of TiN, TaN and other industry standard layer (commensurate to a desired threshold and flatband behavior) are formed over the $2^{nd}$ cladded quantum dot layer (290). The second cladded QD layer may have a different construction of $SiO_x$ cladding and Si core diameter than the $1^{st}$ cladded quantum dot layer (280). The combined set of two cladded quantum dot layers are grown on a thin insulator layer (110) which is comprised of pseudomorphic [Jain and Papadimitrakopoulos, 2006] or lattice matched materials ZnMgS, ZnBeMgs etc (defined earlier in FIG. 6b). The set of two layers of different sized cladded Si dots is referred as layer (2700). Both structures of FIGS. 10a and 10b can be configured in silicon-on-insulator (SOI) full-depleted (FD) or partially depleted (PD) formats. Other FET structures such as FINFETs or double gate FETs can be configured as QD-gate three-state transistors.

FIG. 11 shows the structure of a 3-state field-effect transistor (FET) comprising of two layers of cladded quantum dots on asymmetric InGaAs—InAlAs coupled quantum well transport channel (2100-2) on InP substrate (150-2). Two high-mobility asymmetric coupled quantum well structures as shown in FIGS. 11(a) and 11(b). Here, FIG. 11(a) shows $SiO_x$—Si cladded quantum dots forming the floating gate and FIG. 11(b) illustrates the ZnCdSe—CdSe cladded quantum dots forming the QD gate.

High Mobility Coupled Quantum Well (CQW) Channel FET Structures manifest strained layer high electron mobility. Conventional Single Quantum Well (SQW) transport channels have electrons/holes near the gate. By contrast, asymmetric coupled well (ACQW) channels have the flexibility to reduce interfacial scattering and preserve high mobility. Asymmetric coupled well (ACQW) channel also provide design flexibility by adjusting the separation between channel hosting charge (well #2, layer 153-2) and the $SiO_x$—Si quantum dot gate layers (28, 29) shown in FIG. 11(a). Asymmetric coupled quantum well (CQW) transport channel [Heller et al. 1999, and Jain and Heller, 2002] is having a pseudomorphic or lattice-matched high-band gap (~5 eV) gate insulator layer (1100-2) [comprised of ZnMgSeTe, ZnMgBeSTe described in FIG. 7]. The semiconductor gate (140) over the QD layers and the gate contact (14) is similar to structures described in preceding sections.

The difference in. the structure of FIG. 11(b) is in the use of preferably lattice-matched or pseudomorphic [Jain and Papadimitrakopoulos, 2006] semiconductor cladding-core combination comprising of ZnS cladded-CdSe core (not pseudomorphic in this case), ZnSe—ZnCdSe etc. [similar to layer (280) shown in FIG. 6b] for the dots, replacing $SiO_x$ cladding and Si core, respectively. Here, in the structure of FIG. 11b, we have two such layers (280-1) and (280-2). These cladded dot layers may be deposited in a variety of ways including vapor phase or liquid phase techniques.

FIG. 11(c) describes a CMOS inverter logic gate device using two 3-state quantum dot gate n- and p-channel FETs in LDS configuration. Other logic gates higher in complexity can be envisioned. Here the channel is asymmetric coupled well channel consisting of two InGaAs wells (20A and 25A respectively) and InAlAs barriers. The coupled well construction is designed to confine the carriers representing the inversion charge in the lower quantum InGaAs well (153-2) which is little wider or thicker than well #1 (155-2). The structure is shown on a semi-insulating substrate. This is a semiconductor-on-insulator (SOI) version as the substrate is semi-insulating InP (150-2). The n-channel FET and p-channel FETs have similar two $SiO_x$ cladded Si QD layers ($1^{st}$ layer 28, $2^{nd}$ layer 29) forming QD gate (27), gate insulator (1100-2). The asymmetric coupled well channel is similar in construction, but differs in delta doping (158-2, p-type), and (159-2, n-type) for n-channel and p-channel FETs, respectively. Although the gate layers are shown as 14, they may be different in the selection of materials as the threshold voltages are different for both FETs. The LDS construction is shown by n− (330) for source and n− (340) for the drain side of n-MOS. For the p-MOS, these regions are p− (330-2) and p− (340-2). The n+ regions are 160 and 170 for source and drains for n-MOS. Similarly, the p+ source and drain regions for p-MOS are 160-2 and 170-2. The characteristics off logic inverter using 3-state FETs are discussed in FIGS. 14 and 15.

FIG. 12(a) shows the energy band diagram for a 2-layer QD gate device. This is adapted from Hasaneen et al. (2004) paper where it was proposed for nonvolatile QD memories. Here in 3-state FETs, layer thickness marked as t1 includes the tunnel layer (11) and the cladding $SiO_x$ of lower set of cladded Si dots (28). Layer shown as t2 refers to the combined thickness of the $SiO_x$ claddings of two set of cladded dots (28 and 29). Layer t3 represents the outer $SiO_x$ cladding of QDs (29). The Si dot diameter is represented by tqd, and tqw shows the thickness of inversion layer in the transport channel (21). The energy levels in Si dots are shown in the conduction band. Xg2 and xg1 are the distances of the centers of outer QDs (29) and inner QDs (layer 28) from the gate (14) bottom surface, respectively. This is the band bending at the Si surface. Ec and Ev are conduction and valence band edges. As the thickness t1 is increased, the intermediate state 'i' becomes negligible or disappears.

FIG. 12(b) shows the device of FIG. 8a1 side ways.

FIG. 13(a) shows an n-channel QD-gate 3-state FET structure where two layers of cladded $SiO_x$—Si nanodots (28 and 29) are deposited (to form the QD gate 27-2) by site-specific self-assembly (SSA) technique on the gate insulator #1 (11) between the LDS type source (n− 33, n+ 16) and drain ((n− 34, n+ 17) regions. The transport channel (21) is simple in construction or using coupled quantum well (210, see FIG. 5b/5c1) configuration, where by applying appropriate gate and source-drain voltages carriers are induced. A poly-Si gate (140) is shown along with the gate contact layer (14). Although we are using similar number (11) also for the nonvolatile memory (see FIG. 4), the thickness of insulator (11) here will be different.

SSA technique to assemble $SiO_x$—Si dots provides two features: (i) formation of the QD gate by assembling dots over the depleted region in the p-Si region of the transport channel, and (ii) serving as a nanomask enabling smaller than mask feature channel lengths. The nanomask feature is illustrated in FIG. 13b. SSA provides lateral size reduction via rapid thermal annealing step which produces wider n-regions via lateral diffusion (that is, source and drain extensions or LDS regions) reducing the size of a feature below that is obtained by lithography [F. Jain and F. Papadimitrakopoulos, U.S. application Ser. No. 11/454,963, Jun. 15, 2006].

FIG. 13b. Cross-sectional schematic of a p-channel QD-gate three-state FET structure employing cladded ZnS—CdSe quantum dots in the gate. In this structure, sub 10-30 nm channel length is formed by the SSA of $SiO_x$—Si which serves as a nanomask. Gate insulator #1 (dark region) is grown like FIG. 10b (110 layer which is lattice matched ZnMgS or pseudomorphic ZnBeMgS or ZnMgBeSSe using Atomic layer deposition, MOCVD or MBE) or $SiO_2$ (layer 11, like FIG. 10a) on the transport channel region. This is followed by the deposition of at least two layers of cladded quantum dots such as ZnS-cladded-CdSe dots. Various techniques including layer-by-layer deposition can be employed.

Gate material such as poly-Si (140) can now be deposited along with contact layer (14). Source (p− 330, p+ 160) and drain (p− 340, p+ 17) contacts can also be made following conventional techniques. A schematic processing sequence for QD gate nonvolatile memory and three-state FETs is shown in FIG. 17.

FIG. 14A shows the schematic of a QD-R CMOS inverter [comprising of a QD gate n-FET (171) and a conventional p-FET (172)]. Here, the "intermediate low-current saturation state 'i'" (such as shown in FIG. 8d) for the n-FET along with p-FET behavior results in three distinct states in the $V_{out}$-$V_{in}$ characteristic (173) of the inverter, shown in FIG. 14B. FIG. 14C schematically shows the shift in transfer characteristics when the threshold of one of the two (n- and p-type) QD gate transistors is adjusted by design changes and corresponding processing during fabrication.

The 3-states of inverters and other digital Logic gates can be used in the implementation of multiple valued logic (MVL) functions. Multi valued logic results in lower device count for a given circuit functionality. D-flip-flop (DFF) and other logic blocks can be designed.

FIG. 15(a) schematically shows multi-state logic using both (n-type QD FET, 171 and p-type QD FET 174) 3-state QD FETs in CMOS configuration. This inverter is simulated to result in 4-state input-output inverter characteristics. This will permit novel circuit architectures.

FIG. 15(b): Schematic of a CMOS inverter logic gate using one 3-state QD FET (p-channel device 174) and one variable threshold n-channel FET (175). The device 175 is a nonvolatile memory whose floating QD gate charge can be programmed to result in desired threshold voltage.

FIG. 16(a) shows schematically a method to adjust the threshold voltage of a floating QD gate FET (175) which is used as one of the FET in matched pair (for example, serving as a difference amplifier). Here the QD gate acts as a floating gate memory device with dotted line showing the insulator. The pulse width of the drain voltage pulse determines the amount of charge on the floating gate which in turn determines the threshold voltage of this device. A difference amplifier with the pulse width modulation block (in FIG. 16) is the building block of analog circuits.

Matched FETs are used as differential pair (a circuit building block for analog circuits). The mismatch may be due to process variation or other factors.

FIG. 16(b) Schematic representation of a difference amplifier using two FETs, an adjustable (or programmable) threshold voltage FET (in the form a nonvolatile quantum dot gate nonvolatile memory device) and a three-state quantum dot FET.

Analog circuits comprising QD FETs and Threshold Voltage Adjustment (via Transistor Matching in Difference Amplifiers Using Floating Gate FETs): Here, we illustrate the role of QD floating gate FETs in minimizing mismatch in differential pairs and trimming of passive components. The threshold mismatch impacts many device parameters. It is dependent on bulk charge $Q_b$ fluctuation due to deviation (a) in ion implants in the channel region. $\sigma V_{th} = \sigma Q_b/C_{ox}$ with $Q_b = -qN_a W$ (for n-channel FET, here Na is the doping in the transport channel, and W is the depletion layer thickness under the gate). The corresponding mismatch parameter is $A_{Vt} = (1/2)^{1/2} (t_{ox}/\in_{ox}) q(D_{implant})^{1/2}$; (here, $qN_a$ is related to implant dosage $D_{implant}$). Since threshold voltage also depends on variation in the oxide charge and/or floating charge $Q_{fg}$ (that is, $\sigma V_{th} = \sigma Q_{fg}/C_{ox,eq}$). We can adjust the charge on the quantum dots so that $V_{th}$ can be matched. This is the basic concept in using quantum dot gate FETs to minimize the variations in gate voltage $\sigma^2 (\Delta V_{gs})$, thus improving the accuracy of building blocks and analog-to-digital converters (ADCs) constructed from them.

FIG. 17 (a) Schematic of a typical processing cycle that. can be used in the fabrication of a Si based QD-gate FET exhibiting three-states and a nonvolatile memory is described in terms of basic steps. The details may vary depending on the complexity of device structure and channel length of the scaled-down channel and the resultant device. In a long channel FET version, the source and drain diffusions are done (in industry this is achieved by self-aligned gate technology). An oxide is redeposited and patterned to open the gate region. This is followed by growth of a thin oxide insulator. This is followed by deposition of layers of SiO$_x$-cladded Si nanocrystal quantum dots using site-specific self-assembly [Jain and Papadimitrakopoulos, patent application 2006] Here, two layers of dots are shown. The quantum dots are annealed at a suitable temperature (600-800C). In the case of nonvolatile memory, an additional insulator layer (e.g. SiN layer) is grown. This is followed by making gate, source and drain metalizations. Again in industry, the steps are dictated by channel length, use of high-k dielectric, type of FETs (conventional, FINFETs, etc.), type of process (SOI etc.). Fabricated nonvolatile quantum dot gate memory devices were reported in 2007 [Velampati and Jain, 2007]. Fabricated 3-state FET devices are described in FIGS. 8 and 9.

FIG. 17(b) shows the schematic steps of a processing cycle for an n-channel InGaAs quantum well channel FET structure configured as a three-state device and a nonvolatile memory, respectively. The starting epitaxial substrate (shown separately) is grown an asymmetric coupled quantum well transport channel realized using set of InGaAs—InAlAs layers). This epitaxial substrate is deposited with an oxide or nitride layer serving as a mask for (n+) diffusions or ion implantation to form source and drain regions. This is followed by opening of gate region. In this region, a thin layer of lattice-matched or pseudomorphic wide energy gap semiconductor is grown. This is followed by the site-specific self-assembly of SiO$_x$-cladded Si nanocrystal quantum dots. Generally, two layers or dots are deposited. This is followed by annealing for a suitable duration. Using additional masks, source, drain and gate contacts are formed.

Additional details on processing: We have described a simplified process flow to fabricate long-channel QD-gates. FETs serving as three-state FETs or operating as nonvolatile memory can be fabricated. This preliminary process does not show details employed in the state-of-the-art methodology used in for scaled-down integrated circuits (such as Si/SiGe self-aligned FETs). The process, in particular formation of the QD gate layers, can be adapted for those skilled in the sub-22 nm FET fabrication to accomplish self-aligned gate formation, needed for high performance devices.

The MOS device fabrication involves the selection of an appropriate substrate (e.g. a p-Si (100) substrate with an appropriate resistivity, or a silicon-on-insulator (SOI) substrate (with appropriate semiconductor layer thickness and resistivity). The sample goes through the conventional source and drain implants or diffusions using appropriate mask set. After the source and drain diffusions/implants are completed, and the gate window is opened, an ultra-thin oxide about a thickness (determined by the FET design) of ~2.0 nm is grown on the substrate by dry oxidation. Alternately, a layer of lattice-matched wide energy gap semiconductors (such as ZnMgS, ZnMgBeS) or high-k insulators (e.g. hafnium aluminum oxide, PZT) is grown [ref: Lee et al. 2003].

The deposition of gate insulator (SiO$_2$, high-k, or lattice matched, pseudomorphic semiconductor) is followed by deposition of one or more layers (two layers for 3-state FET) of about 6-8 nm Si nanocrystals with ~1 nm SiO$_x$ cladding are self-assembled in the gate region over the p-type channel. Generally, this is done by immersion of the wafer in a supernatant consisting of SiO$_x$—Si nanoparticles for a certain duration which results in one or two layers.

This is followed by deposition of gate insulator #2 for nonvolatile QD gate memory. In the case of 3-state QD-gate FETs, no intentional insulator on top of nanodots is grown. Now a gate material (such as metal or poly-Si or poly-SiGe gate) is deposited per design of scaled-down FET. Deposition of source and drain Ohmic contact layer, and a gate contact material layer is carried out. The fabricated devices are interconnected by following a process interconnect methodology.

In the case of InP devices, FIG. 17(b) schematically shows the processing cycle. Here, we are using an InGaAs—InAlAs asymmetric coupled well channel as the starting epitaxial layered structure which is grown on semi-insulating (SI) InP substrate. This is equivalent of semiconductor on insulator (SOI). The difference in the process cycle from Si (FIG. 17a) is in terms of the technique of forming source and drain implants and diffusions as well as gate insulator over which $SiO_x$—Si quantum dots are assembled. Once the source and drain regions are formed using a $SiO_2$ masking layer, a thin layer (serving as a barrier layer) of lattice-matched wide energy gap semiconductor (such as ZnMgBeSeTe, ZnMg-SeTe) is epitaxially grown. This is because of the fact that there is no native oxide for III-V material system as we have in Si (in case of Si, $SiO_2$ layer could serve this purpose). Now $SiO_x$—Si cladded quantum dot can be assembled. The three-state device has no intentional gate insulator #2 between the QDs and the gate material. The nonvolatile memory does have an insulator layer. These are detailed in previous figures.
Additional Details:

Multi-state behavior for logic and memory applications in electronics [e.g. resonant tunneling transistors [Capasso et al. 1990]]. Recently, some groups have reported hysteresis in GaAs—AlGaAs transistors [Yusa et al, 1997; Rack et al. 2002] comprising InAs quantum dots. Multi-valued logic (MVL) has been investigated for logical and arithmetic functions [Gonzales et al. 1998; Radanovic et al. 1996; Ishizuka et al. 1997], and it requires fewer gates and transistors, reducing Si active area. NEC has developed multi-gigabit DRAMs using MVL [Okuda et al. 1997]. However, MVL has not been widely adapted because of reduced noise margins, increased circuit complexity, and static current draw in CMOS. CMOS logic gates using QD-gate FETs reduce static current and noise margin related drawbacks.

Analog-to-digital converters (ADCs) and digital-to-analog converters (DACs) are essential in the implementation of mixed signal system-on-a-chip (SOC). In terms of ADCs, higher resolution at lower sampling speeds is obtained using delta-sigma configurations. Over-sampling delta-sigma ADCs are very suitable for scaled-down MOS devices as they use the high speed sampled low bit signals instead of highly accurate analog signals. Various architectures of these have been reported [Norsworthy et al. 1997]. Flash ADCs, which can achieve higher sampling speeds but relatively low resolution, generally require deep sub-micron processing. To achieve higher resolution while maintaining high-speeds, ADCs are generally implemented in pipeline architectures. In flash ADCs, comparator offset must be controlled to limit large errors [Flynn et al. 2003] using device sizing, offset nulling, averaging, and digitally controlled trimming. Except for the sample and hold (S/H) stage, the reconfigurable pipeline ADC [Liu et al., 2002] is composed of a fully differential sample and hold amplifier (SHA), a 1-bit sub-ADC (a comparator) and 1-bit sub digital-to-analog converter (DAC) [a SHA with switched capacitor circuit]. Calibration/trimming is needed to enhance the bit resolution beyond 10-12 bits [Chuang et al. 2002], particularly in pipelined and multistage ADCs.

QD-gate FETs offer unprecedented opportunities for advancements not only for digital circuits and nonvolatile and ternary content addressable memories (TCAMs), but also for RF circuit building blocks for high-resolution ADCs.
Three-State FETs: Theoretical Background The effect of carrier tunneling on output ($I_{DS}$-$V_{DS}$) and transfer characteristics ($I_{DS}$-$V_G$) can be explained in terms of variations in threshold voltage as a function of charge on the quantum dot layers [QD layer #1 (layer 28, FIG. 8a1) which is near the quantum well channel; and QD layer #2 (29) near the gate electrode]. As the gate voltage $V_g$ is increased for a given drain to source voltage ($V_{DS}$), the charge from the channel tunnels to QD layers. This changes the net gate charge on the quantum dots in the gate insulator. The gate insulator comprises of an insulator layer (FIG. 8a1) and two layers of $SiO_x$—Si nanocomposite dots. This in turn changes the threshold voltage.

This can be understood by simplifying the complexity. Using standard equations available in standard MOS textbooks [Yang 1978, Taur and Ning 1998], we can write threshold voltage as:

$$V_{TH} = V_{FB} + \frac{1}{C_o} qN_A \sqrt{\frac{2\varepsilon_{sr}\varepsilon_o(2\psi_B + V_x)}{qN_A}} + 2\psi_B, \quad (1)$$

$$V_{FB} = \varphi_{ms} - \frac{Q_{ox}}{C_{ox}},$$

$$\psi_B = \frac{kT}{q} \ln \frac{N_A}{n_i},$$

Change in threshold voltage $V_{TH}$ depends on surface potential PhisS (see FIG. 12a) in the channel [at a given point x], difference in metal work function difference $\phi_{ms}$, and oxide charge $Q_{ox}$, and oxide capacitance $C_o$ for a given doping $N_A$ in p-Si. The charge distribution p(x) in the QD gate is not located at the $SiO_2$—Si boundary as is $Q_{ox}$ assumed in Equation (1). It is distributed and can be expressed by Yang [1978] and Taur and Ning [1998]. In the case of quantum dot layers, the charge is composed of discrete values represented by summation, and conventionally distributed or interface charge $Q_{ox}$ (not shown in Eq. 2)

$$\Delta V_{FB} = \Delta V_{TH} \quad (2)$$

$$= -\frac{q}{C_o} \int_0^{x_g} \frac{x\rho(x)}{x_g} dx$$

$$= -\frac{q}{C_o} \left[ \sum \frac{x_{QD1} N_{QD1}}{x_g} + \sum \frac{x_{QD2} N_{QD2}}{x_g} \right]$$

Here, $x_g$ is the gate insulator thickness. The charge density in a quantum dot layer can be expressed as $q\rho(x)=qnN_{QD}$, where $N_{QD}$ is the number of dots per unit area under the gate, and n is the number of positive charges per dot at the $SiO_x$—Si nanocrystal boundary. $X_{QD1}$ and $X_{QD2}$ are shown as xg1 and xg2 in FIG. 12a.

The value of $nN_{QD}$ depends on the tunneling probability. As a result, threshold voltage will change as the charge on the quantum dot layers changes due to tunneling from the transport channel. There is an inherent equilibrium charge density on the $SiO_x$—Si dots (similar to any $SiO_2$—Si or high-κ Si interface). This charge value is decreased as electrons tunnel to allowed states in QDs (changing $qnN_{QD}$ value by neutralizing some of the positive interface charge). That is, net charge (Eq. 2) on the gate insulator (including QD layers) decreases, and this means the change $\Delta V_{FB}$ or $\Delta V_{TH}$ is less negative. Therefore, ($V_G$-$V_{TH}$) does not change very much as VG is increased. This results in nearly constant drain current as can be seen from a very simplistic $I_D$-$V_{DS}$ equation, and results in "low-current saturation" or intermediate state "i".

$$I_D = \left(\frac{W}{L}\right) C_o \mu_n \left[(V_G - V_{TH})V_{DS} - \frac{V_{DS}^2}{2}\right] \quad (3)$$

4-State FETs: Our simulations have shown that two intermediate states 'i$_1$' and 'i$_2$' may result if three layers of cladded quantum dots are incorporated in the FET.

Ostraat et al. [2001] have reported floating gate memory structures using Si nanocrystals. They have summarized the advantages of nanocrystal based charge storage including: 1) reduced punch-through by reducing drain to floating gate coupling, 2) reduction in stress induced leakage currents, and 3) potentially enhanced retention times.

Kouklin et al. [2000] have also reported bistable devices using self-assembled 10 nm CdS quantum dots using nanoporous anodic alumite films as the template. The selection of composition provides control of strain in ZnS—CdSe, ZnS—ZnSSe, and ZnS—ZnCdSe quantum dots present a unique opportunity to design trap density, and hence the memory parameters. Hasaneen et al. [2004] has reported a model for QD gate nonvolatile memory using BSIMv3.

CITED REFERENCES

S. Tiwari, F. Rana, K. Chan, H, Hanafi, W. Chan and D. Buchanan, "Volatile and non-volatile memories in silicon with nano-crystal storage," IEDM, pp. 521-525, December 1995.

S. Tiwari, et al., "A silicon nanocrystals based memory," Appl. Phys. Lett., 68 (10), 1377, 1996

E-S. Hasaneen, E. Heller, R. Bansal, W. Huang, and F. Jain, Solid State Electronics, Vol. 48, p. 2055, 2004

M. L. Ostraat, J. W. De Blauwe, M. L. Green, L. D. Bell, M. L. Brongersma, J. Caspersdn, R. C. Flagan, and H. A. Atwater, "Synthesis characterization of aerosol silicon nanocrystal nonvolatile floating-gate memory devices", Applied Physics Letters, Vol. 79, pp. 433-435, July 2001

P. Cappelletti et al, Flash Memories, Kluwer Press 1999

W. Brown and J. Brewer, Nonvolatile Semiconductor Memory Technology, IEEE Press, 1998

P. Cappelletti et al, Flash Memories, Kluwer Press 1999.

W. Brown and J. Brewer, Nonvolatile Semiconductor Memory Technology, IEEE Press, 1998.

A. Kumar and S. Tiwari, IEEE Trans. Nanotechnology, p. 247 December 2002

F. Jain and F. Papadimitrakopoulos, Site-specific Nanoparticle Self-Assembly, U.S. application Ser. No. 11/454,963, Jun. 15, 2006.

Jeunghoon Lee, Mathew Mathai, Faquir Jain, and Fotios Papadimitrakopoulos, "Layer-By-Layer Growth of CdSe based Nanocrystal Light-Emitting Diodes", J. Nanoscience, Vol #1, pp. 59-64, March 2001

N. Kouklin, S. Bandyopadhyay, S. Tereshin, A. Varfolomeev, and Zaretsky, "Electronic bistability in electrochemically self-assembled quantum dots: A potential nonvolatile random access memory", Applied Physics Letters, Vol. 76, pp. 460-462, January 2000.

F. Jain and E. Heller, "Coupled Well Field-Effect Transistors" U.S. Pat. No. 6,498,360, Dec. 24, 2002;

E. Heller, S. Islam, G. Zhao, F. Jain, "Analysis of In$_{0.52}$Al0.48As/In$_{0.53}$Ga$_{0.47}$As/InP quantum wire MODFETs employing coupled well channels," Solid-State Electronics 1999; 43: 901-914.

S-M. Kang and Y. Leblebici, McGraw Hill, CMOS digital integrated circuits, 2003

E. S. Yang, Fundamentals of Semiconductor Devices, McGraw Hill, New York, N.Y., 1978.

Y. Taur and T. Ning, Fundamentals of Modern VLSI Devices, Cambridge University Press, Cambridge, England, 1998.

F. Jain, "Improved LDD-FET Structures with Lightly Doped n-Sheaths Around the n+ Source/Drain Regions", filed with the U.S. Pat. No. 4,949,136, Aug. 14, 1990.

Bin Yu, L. Chang, S. Ahmed, H. Wang, S. Bell, C. Yang, C. Tabery, C. Ho, Q. Xiang, T-J. King, J. Bokor, C. Hu, M-R. Lin, and D. Kyser, "FinFET Scaling to 10 nm Gate Length," IEDM Tech. Digest, p. 251, December 2002.

C. H. Huang, D. S. Yu, A. Chin, C. H. Wu, W. J. Chen, C. Zhu, M. F. Li, B. J. Cho, and D. Kwong, "Fully Silicided NiSi and Germanided NiGe Dual Gates on SiO$_2$/Si and Al$_2$O$_3$/Ge-On-Insulator MOSFETs", IEDM Digest 2003, 2003.

S. Takagi, T. Mizuno, T. Tezuka, N. Sugiyama, T. Numata, K.Usuda, Y. Moriyama, S, Nakaharai, J. Koga, A. Tanabe, N. Hirashita and T. Maeda, "Channel Structure Design, Fabrication and Carrier Transport Properties of Strained-Si/SiGe-On-Insulator (Strained-SOI) MOSFETs", IEDM Digest 2003.

F. Jain and F. Papadimitrakopoulos, U.S. Pat. No. 6,992,317 B2, Jan. 31, 2006.

J. Lee, X. Wang, W. Bai, N. Lu, and D.-L. Kwong, "Theoretical and experimental investigation of Si nanocrystal memory device with HfO$_2$ high-k tunneling dielectric," IEEE Trans. Elec. Dev., vol. 50, pp. 2067-2072, October 2003.

F. Capasso et. al. (Chapter 7) in Physics of Quantum Electron Devices, Springer Verlag, 1990.

G. Yusa and H. Sakaki, Appl. Phys. Lett. 70, 345-347 (1997).

A. Rack, R. Wetzler, A. Wacker and E. Scholl, Proc. of 26$^{th}$ Int. Conf. on Phys. of Semi., ICPS-16, 2002;

A. F. Gonzalez, P. Mazumder, Multiple-valued signed digit adder using negative differential resistance devices, IEEE Trans. on Computers 47, 9, (1998), 947-959.

B. Radanovic, M. Syrzycki, Current-mode CMOS adders using multiple-valued logic Canadian Conference on Electrical and Computer Engineering, (1996), 190-193;

O. Ishizuka, D. Handoko, VLSI design of a quaternary multiplier with direct generation of partial products, Proc. 27th Int. Symp. Multiple-Valued Logic, (1997), 169-174;

T. Okuda, T. Murotani, A four-level storage 4 Gb DRAM IEEE Journal of Solid-State Circuits 32, 11, (1997), 1743-1747.

S, Norsworthy, R. Schreifer, G. Temes, "Delta-Sigma Data Conveters", IEEE Press, 1997;

Michael P. Flynn, Conor Donovan and Linda Sattler, "Digital calibration incorporating redundancy of flash ADCs", IEEE transactions on circuit and systems-II, vol. 50, No. 5, pp. 205-. 213, May 2003;

Hui Liu and Marwan Hassoun, "A 9-b 40-Msamples Reconfigurable pipeline analog-to-digital converter", IEEE transactions on circuit and systems-II, vol. 49, No. 7, pp. 449-456, July 2002;

Shang-Yuan Chuang and Terry L. Sculley, "A Digitally self-calibrating 14-bit 10-MHz CMOS pipelined A/D converter", IEEE Journal of solid-state circuits, vol. 37, No. 6, pp. 674-683, June 2002;

R. Velampati and F. C. Jain, A Novel Nonvolatile Memory Using SiOx-Cladded Si Quantum Dots, NSTI Nanotech, Santa Clara, Calif., May 20-24 2007.

The invention claimed is:

1. A nonvolatile memory device, comprising:
a field-effect transistor (FET) structure having a source, a drain, a gate region and a semiconductor substrate, wherein a transport channel is located between the source and the drain and is controlled by a voltage applied to the gate region;

wherein the gate region has a multilayer structure having:
a first insulator layer located next to said transport channel selected from a group consisting of an insulator and a wide energy gap lattice matched semiconductor and a pseudomorphic semiconductor layer, wherein the transport channel is formed on the surface of the semiconductor substrate adjacent to the first insulator layer wherein the first insulator layer has assembled on it a first set of cladded quantum dots selected from a group consisting of Si nanocrystal quantum dots cladded with a thin $SiO_x$ cladding layer, and Ge nanocrystal quantum dots cladded with a thin $GeO_x$ cladding layer, wherein the first set of cladded quantum dots include at least one layer of cladded nanocrystal quantum dot layers;

wherein the cladded nanocrystal quantum dots are individually cladded with a thin cladding layer, and wherein the cladding of each of the cladded nanocrystal quantum dots is in contact with the cladding of other cladded nanocrystal quantum dots in its proximity in the first set of cladded nanocrystal quantum dots, wherein the thin SiOx cladding layer on the Si nanocrystal quantum dots and thin GeOx cladding layer on the Ge nanocrystal quantum dots are uniform and deposited on the nanocrystal quantum dots from all sides, and wherein the cladded nanocrystal quantum dots are spherical, and wherein the thin cladding layer over the nanocrystal quantum dots are configured to function as an electronic barrier layer;

a control gate insulator layer deposited over the first set of cladded quantum dots, wherein each of the cladded quantum dots is completely cladded with a thin cladding layer and wherein the first set of cladded quantum dots form a floating quantum dot gate; and wherein a control gate electrode is deposited over the control gate insulator layer, wherein a voltage pulse applied to the control gate electrode with respect to the source controls the amount of charge trapped in the floating quantum dot gate during a WRITE operation.

2. The nonvolatile memory device as described in claim 1 comprising:

a field-effect transistor (FET) structure with a source, a drain, a gate region and a semiconductor substrate selected from Si and silicon-on-insulator (SOI) in which a transport channel is formed between said source and the drain and controlled by the voltage applied to said gate region;

wherein the gate region has a multilayer structure having:
said first layer next to the transport channel is in the range of 10-100 Å in thickness and is selected from group consisting of $SiO_2$, hafnium oxide and its variations, lattice-matched ZnMgS and other high-k materials, with the first and second set of $SiO_x$ cladded-Si dots with two layers of dot in the first and second set, wherein each layer of nanocrystal quantum dots having a cladding of $SiO_x$ (1-5 nm in thickness) on Si nanocrystal core with thickness of 3-10 nm, wherein the second set of cladded nanocrystal quantum dots are separated by second insulator 2-10 nm in thickness and is selected from $SiO_2$, SiON, hafnium oxide and its variations, and other high-k materials, said second set of dots having on their top deposited a control gate insulator 3-10 nm in thickness and is selected from $SiO_2$, SiON, hafnium oxide and its variations, and other high-k materials, the control gate insulator layer being deposited on the second set of cladded nancrystal quantum dots, and wherein a control gate electrode is deposited on the control gate insulator layer, wherein the voltage pulse applied to control gate electrode with respect to the source controls the amount of charge trapped in the floating quantum dot gate during the WRITE operation.

3. The nonvolatile memory device of claim 2, realized in silicon-on-insulator (SOI) substrate, and having a back gate to facilitate additional bit manipulation.

4. The nonvolatile memory device as described in claim 1, wherein said first layer of insulator has assembled on it the first set of cladded quantum dots, wherein the first set of cladded quantum dots includes at least one layer of uniformly cladded nanocrystal quantum dots, and wherein the first layer of cladded nanocrystal quantum dots is comprised of a nanocrystal core of a first semiconductor material, with a thin cladding layer, and the second cladded nanocrystal quantum dot core is comprising of a second semiconductor material with a thin cladding layer, wherein the energy gap of the second semiconductor material is larger than the energy gap of the first semiconductor material, wherein a control gate insulator layer is deposited over the first set of cladded quantum dots, the first set of cladded quantum dots forming the floating quantum dot gate between the first insulator and the control gate insulator, and a control gate electrode is deposited over said control gate insulator layer, which controls the amount of charge trapped in said floating quantum dot gate, thereby rendering said field-effect transistor to serve as a non-volatile memory device storing multiple of bits in the form of charges in first and second layers of cladded nanocrystal quantum dots.

5. The nonvolatile memory device as described in claim 4, wherein the transport channel is composed of asymmetric coupled quantum wells realized using Si-SiGe-Si-SiGe strained layer well and barrier structure on Si substrate, said floating quantum dot gate having on top of it a control gate insulator layer which is constructed from at least one of $SiO_2$, SiON, $Si_3N_4$.

6. The nonvolatile memory device structure as described in claim 4, wherein the transport channel is composed of InGaAs (wells)-InALAs (barrier) forming an asymmetric coupled quantum well structure on InP substrate, and the first insulator layer is realized by lattice matched and/or pseudomorphic wide-energy gap semiconductors which is selected from the group consisting of ZnMgBeSeTe, ZnMgBeSTe. and their variations; and the floating gate is composed of one set consisting of two layers of cladded GeOx-Ge quantum dots, and wherein two layers of cladded GeOx-Ge quantum dots having different core diamters of Ge dots in two layers, wherein the first layer in proximity of first insulator layer having larger core diameter.

7. The nonvolatile memory of claim 4 where the first set of cladded dots are $SiO_x$-Si and the second dots are ZnS-cladded-CdSe or semiconductor cladded nanocrystal dots.

8. The nonvolatile memory device of claim 4, realized in silicon-on-insulator (SOI) substrate, and having a back gate to facilitate additional bit manipulation.

9. The nonvolatile memory device as described in claim 1, wherein said control gate electrode is selected from a semiconductor and metal material to provide a work function that results in operating flat band and threshold voltages for said field-effect transistor,
wherein source and drain construction is selected from lightly doped drain (LDD) and lightly doped sheath (LDS) and variation thereof.

10. The nonvolatile memory device as described in claim 1, further comprising an additional transport channel under the first gate insulator and the floating quantum dot gate, wherein the additional transport channel includes an asymmetric coupled quantum well structure having two wells and two barrier layers, the two wells and barrier layers being composed of semiconductor layers.

11. The nonvolatile memory device as described in claim 10, wherein said coupled well structure is a strained layer structure with Si quantum well layers sandwiching a SiGe barrier layer to result in strain in the Si wells grown on a Si substrate.

12. The nonvolatile memory device as described in claim 1, wherein said charge trapped in said floating gate is adjusted by manipulations selected from a group consisting of source-drain and gate voltages in order to transfer hot carriers from the transport channel near the drain end, and transferring the charge from the channel by adjusting the gate control electrode voltage.

13. The nonvolatile memory device structure as described in claim 1, wherein the transport channel is composed of InGaAs epitaxially grown on InP substrate, and the first insulator layer is realized by lattice matched and/or pseudomorphic wide-energy gap semiconductors selected from the group consisting of ZnMgBeSeTe, ZnMgBeSTe and their variations; and
wherein first insulator layer has assembled on it a first set of cladded quantum dots consisting of Ge nanocrystal quantum dots cladded with a thin GeOx cladding layer,
wherein a control gate insulator layer is deposited over the first set of cladded quantum dots,
wherein the first set of cladded nanocrystal quantum dots form the floating quantum dot gate,
wherein said control gate insulator layer selected from a group comprising of $SiO_2$, SiON, $Si_3N_4$, HfO2
a control gate electrode is deposited over said control gate insulator layer, which controls the amount of charge trapped in said floating gate, thereby rendering said field-effect transistor to serve as a non-volatile memory device storing multiple of bits in the form of charges in cladded nanocrystal quantum dots.

14. The nonvolatile memory device structure as described in claim 13, wherein the transport channel is composed of InGaAs (wells)-InAlAs (barrier) forming an asymmetric coupled quantum well structure on InP substrate, and the first insulator layer is realized by lattice matched and/or pseudomorphic wide-energy gap semiconductors which is selected from the group consisting of ZnMgBeSeTe and ZnMgBeSTe.

15. The nonvolatile memory device as described in claim 1, wherein said source and drain are formed by a method which includes at least one of ion implantation and diffusions in a semiconductor substrate,
wherein the first set of cladded quantum dot are self-assembled on the first gate insulator layer and are annealed in the range of 500-900C,
wherein the control gate insulator layer is deposited using chemical vapor deposition method on top of said first set of cladded quantum dot layers.

16. The nonvolatile memory device as described in claim 1, wherein the FET is programmed as a variable threshold FET by storing charge on spatially selected cladded quantum dots by the manipulation of source, drain and gate voltages.

17. The nonvolatile memory device as described in claim 16, further comprising a second FET which is combined with said device to form a matched pair of FETs to build analog circuits for the implementation of analog circuit building blocks.

18. A nonvolatile memory device, comprising:
a field-effect transistor (FET) structure having a source, a drain, a gate region and a semiconductor substrate, wherein a transport channel is located between the source and the drain and is controlled by a voltage applied to the gate region;
wherein the gate region has a multilayer structure having:
a first insulator layer located next to said transport channel selected from the a group consisting of an insulator and a wide energy gap lattice matched semiconductor and a pseudomorphic semiconductor layer,
wherein the transport channel is formed on the surface of semiconductor substrate adjacent to the first insulator layer,
wherein the first insulator layer has assembled on it a first set of cladded quantum dots from a group consisting of $SiO_x$-cladded Si nanocrystal quantum dots, and $GeO_x$-cladded Ge nanocrystal quantum dots,
wherein the first set of cladded quantum dots include at least one layer of cladded nanocrystal quantum dots;
a second insulator layer deposited over the first set of cladded quantum dots,
wherein the second insulator layer has assembled on it a second set of cladded quantum dots,
wherein the second set of cladded quantum dots include at least one cladded nancrystal quantum dot layer;
a third insulator layer deposited over the second set of cladded quantum dots,
wherein each quantum dot in first and second set is individually cladded by a thin cladding layer, and wherein cladding of every cladded quantum dot is in contact with cladding of other quantum dots in its proximity in the said first set of cladded quantum dots, and
wherein the first set of cladded quantum dots and second set of cladded quantum dots form a floating quantum dot gate; and
a control gate electrode deposited over the third insulator layer, wherein the control gate electrode controls the amount of charge trapped in the floating quantum dot gate, and,
wherein said two sets of quantum dot layers are separated by a p-type semiconductor layer which is deposited on top said second insulator, which facilitates self-assembly of $SiO_x$-Si cladded dot forming said second set of quantum dot layers, and said p-type semiconductor layer having a thin insulator below the second set of cladded quantum dots.

* * * * *